(12) United States Patent
Okamoto

(10) Patent No.: US 9,673,377 B2
(45) Date of Patent: Jun. 6, 2017

(54) COMPOUND SEMICONDUCTOR DEVICE AND METHOD OF MANUFACTURING THE SAME

(71) Applicant: FUJITSU LIMITED, Kawasaki-shi, Kanagawa (JP)

(72) Inventor: Naoya Okamoto, Isehara (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 15/012,268

(22) Filed: Feb. 1, 2016

(65) Prior Publication Data

US 2016/0149118 A1    May 26, 2016

Related U.S. Application Data

(63) Continuation of application No. PCT/JP2013/071341, filed on Aug. 7, 2013.

(51) Int. Cl.
*H01L 21/00* (2006.01)
*H01L 29/00* (2006.01)
(Continued)

(52) U.S. Cl.
CPC ...... *H01L 41/1132* (2013.01); *H01L 21/0254* (2013.01); *H01L 29/2003* (2013.01);
(Continued)

(58) Field of Classification Search
CPC ... H01L 41/047; H01L 41/113; H01L 41/187; H01L 41/29; H01L 41/332; H01L 41/39;
(Continued)

(56) References Cited

U.S. PATENT DOCUMENTS

| 6,928,878 B1 | 8/2005 | Eriksen et al. |
| 2006/0076855 A1 | 4/2006 | Eriksen et al. |

(Continued)

FOREIGN PATENT DOCUMENTS

| JP | 02-073162 | 3/1990 |
| JP | 2006-098408 | 4/2006 |
| JP | 2012-224539 | 11/2012 |

OTHER PUBLICATIONS

S. Trolier-McKinstry et al., "Thin Film Piezoelectrics for MMEMS", Journal of Electroceramics,12, 7-17, 2004, 2004 Kluwer Academic Publishers, Manufactured in The Netherlands (11 pages).
(Continued)

*Primary Examiner* — Nikolay Yushin
(74) *Attorney, Agent, or Firm* — Fujitsu Patent Center

(57) ABSTRACT

A compound semiconductor device includes: a flexible part; a first nitride semiconductor layer above a surface of the flexible part, the first nitride semiconductor layer including a first polar plane and a second polar plane intersecting the surface; a second nitride semiconductor layer in contact with the first nitride semiconductor layer on the first polar plane, a lattice constant of the second nitride semiconductor layer being different from that of the first nitride semiconductor layer; a third nitride semiconductor layer in contact with the first nitride semiconductor layer on the second polar plane, a lattice constant of the third nitride semiconductor layer being different from that of the first nitride semiconductor layer; a first ohmic electrode above an interface between the first nitride semiconductor layer and the second nitride semiconductor layer; and a second ohmic electrode above an interface between the first nitride semiconductor layer and the third nitride semiconductor layer.

17 Claims, 20 Drawing Sheets

(51) Int. Cl.

| | | |
|---|---|---|
| H01L 41/113 | (2006.01) | |
| H01L 41/047 | (2006.01) | |
| H01L 41/187 | (2006.01) | |
| H01L 41/29 | (2013.01) | |
| H01L 41/332 | (2013.01) | |
| H02N 2/18 | (2006.01) | |
| H01L 41/316 | (2013.01) | |
| H01L 21/02 | (2006.01) | |
| H01L 29/20 | (2006.01) | |
| H01L 29/205 | (2006.01) | |
| H01L 41/08 | (2006.01) | |
| H01L 41/16 | (2006.01) | |
| H01L 41/39 | (2013.01) | |

(52) U.S. Cl.
CPC .......... *H01L 29/205* (2013.01); *H01L 41/047* (2013.01); *H01L 41/0805* (2013.01); *H01L 41/113* (2013.01); *H01L 41/16* (2013.01); *H01L 41/187* (2013.01); *H01L 41/29* (2013.01); *H01L 41/316* (2013.01); *H01L 41/332* (2013.01); *H01L 41/39* (2013.01); *H02N 2/18* (2013.01)

(58) Field of Classification Search
CPC . H01L 41/0805; H01L 41/1132; H01L 41/16; H01L 41/316; H01L 21/0254; H01L 21/02458; H01L 21/02433; H01L 29/2003; H01L 29/205; H01L 29/045; H02N 2/18
See application file for complete search history.

(56) References Cited

U.S. PATENT DOCUMENTS

2011/0101419 A1* 5/2011 Hata ...................... B82Y 20/00
257/190
2012/0267638 A1 10/2012 Lee et al.

OTHER PUBLICATIONS

B. Lin et al., "Modeling and testing of PZT and PVDF piezoelectric wafer active sensors", Smart Materials and Structures, 15 (2006) pp. 1085-1093 (9 pages).

T. Kant et al., "Cylindrical bending of piezoelectric laminates with a higher order shear and normal deformation theory", Computers and Structures 86 (2008) pp. 1594-1603 (10 pages).

O. Ambacher et al., "Two-dimensional electron gases induced by spontaneous and piezoelectric polarization charges in N- and Ga-face AlGaN/GaN heterostructures", Journal of Applied Physics, (1999) vol. 85, No. 6, Mar. 15, 1999, pp. 3222-3233 (12 pages).

M. Akiyama et al., "Development of a pressure sensor using a piezoelectric material thin film", Synthesiology, vol. 5, No. 3, (2012) Mar. 2012, pp. 162-170 (9 pages).

N. F. Gardner et al., "Polarization anisotropy in the electroluminescence of m-plane InGaN—GaN multiple-quantum-well light-emitting diodes", AIP Applied Physics Letters, 86 (2005) 111101 (4 pages).

P. Waltereit et al., "Growth of M-plane GaN(1 100) on γ-LiAlO2(100)" Journal of Crystal Growth 218 (2000) pp. 143-147 (5 pages).

A. Kobayashi et al., Kobayashi et al., "Room temperature epitaxial growth of m-plane GaN on lattice-matched ZnO substrates", Applied Physics Letters 90 (2007) 041908 (4 pages).

R. Armitage et al., "M-plane GaN grown on m-sapphire by metalorganic vapor phase epitaxy", Applied Physics Letters 92 (2008) 092121 (4 pages).

K. Okuno et al., "m-Plane GaN Films Grown on Patterned a-Plane Sapphire Substrates with 3-inch Diameter", Applied Physics Express 2 (2009) 031002 (3 pages).

X. Ni et al., "Nonpolar m-plane GaN on patterned Si(112) substrates by metalorganic chemical vapor deposition", Applied Physics Letters 95 (2009) 111102 (4 pages).

M. Kuroda et al., "Nonpolar (11-20) plane AlGaN/GaN heterojunction field effect transistors on (1-102) plane sapphire", Journal Applied Physics 102 (2007) 093703 (6 pages).

R. Schuber et al., "Growth of M and Aplane GaN on IGaO2 by plasmaassisted MBE", AIP Conference Proceedings 1399 (2011) 191 (3 pages).

M. D. Craven et al., "Microstructural evolution of a-plane GaN grown on a-plane SiC by metalorganic chemical vapor deposition", Applied Physics Letters 84 (2004) 1281 (4 pages).

International Search Report, mailed in connection with PCT/JP2013/071341 mailed Sep. 17, 2013 (1 page).

* cited by examiner

US 9,673,377 B2

COMPOUND SEMICONDUCTOR DEVICE AND METHOD OF MANUFACTURING THE SAME

CROSS-REFERENCE TO RELATED APPLICATION

This application is a continuation application of International Application PCT/JP2013/071341 filed on Aug. 7, 2013 and designated the U.S., the entire contents of which are incorporated herein by reference.

FIELD

The embodiments discussed herein are directed to a compound semiconductor device and a method of manufacturing the same.

BACKGROUND

A piezoelectric element can be used for an actuator, a pressure sensor, a power generator, and the like. In recent years, it has been expected to apply a piezoelectric element to energy harvesting, in which small energy in the environment generated by vibration, oscillation, and the like is harvested to be utilized. Further, it has been demanded to develop a piezoelectric element which can be used even at a high temperature. A nitride semiconductor is promising as a material of the piezoelectric element used at a high temperature, and studies regarding a piezoelectric element with nitride semiconductor have been conducted.

A film-like piezoelectric element in which a GaN layer is interposed between two AlGaN layers and a positive electrode and a negative electrode are provided to the two interfaces, respectively, is exemplified as the piezoelectric element with nitride semiconductor. However, power generation efficiency with respect to an applied voltage is insufficient in the conventional piezoelectric element with nitride semiconductor.

Patent Literature 1: Japanese Laid-open Patent Publication No. 2006-98408
Non-Patent Literature 1: TROLIER-MCKINSTRY et al., Journal of Electro ceramics, 12, 7-17, 2004
Non-Patent Literature 2: Lin et al., Smart Materials and Structures, 15, 1085-1093, 2006
Non-Patent Literature 3: Kant et al., Computers and Structures, 86, 1594-1603, 2008
Non-Patent Literature 4: Ambacher et al., Journal of Applied Physics, 85, 3222-3233, 1999
Non-Patent Literature 5: Akiyama et al., Synthesiology, Vol. 5, 162-170, 2012

SUMMARY

According to an aspect of the embodiments, a compound semiconductor device includes: a flexible part; a first nitride semiconductor layer above a surface of the flexible part, the first nitride semiconductor layer including a first polar plane and a second polar plane intersecting the surface; a second nitride semiconductor layer in contact with the first nitride semiconductor layer on the first polar plane, a lattice constant of the second nitride semiconductor layer being different from that of the first nitride semiconductor layer; a third nitride semiconductor layer in contact with the first nitride semiconductor layer on the second polar plane, a lattice constant of the third nitride semiconductor layer being different from that of the first nitride semiconductor layer; a first ohmic electrode above an interface between the first nitride semiconductor layer and the second nitride semiconductor layer; and a second ohmic electrode above an interface between the first nitride semiconductor layer and the third nitride semiconductor layer.

According to another aspect of the embodiments, a method of manufacturing a compound semiconductor device includes: forming a first nitride semiconductor layer above a surface of a flexible part, the first nitride semiconductor layer including a first polar plane and a second polar plane intersecting the surface; forming a second nitride semiconductor layer in contact with the first nitride semiconductor layer on the first polar plane and a third nitride semiconductor layer in contact with the first nitride semiconductor layer on the second polar plane, a lattice constant of the second nitride semiconductor layer being different from that of the first nitride semiconductor layer and a lattice constant of the third nitride semiconductor layer being different from that of the first nitride semiconductor layer; forming a first ohmic electrode above an interface between the first nitride semiconductor layer and the second nitride semiconductor layer; and forming a second ohmic electrode above an interface between the first nitride semiconductor layer and the third nitride semiconductor layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

The inventor of the present application conducted studies regarding the reason why it is not possible to obtain sufficient power generation efficiency in the above-described conventional film-like piezoelectric element in which a GaN layer is interposed between two AlGaN layers. As a result, it was clarified that a part of the reason is that when the piezoelectric element is curved for causing generation of a voltage, a tensile stress acts on one of the two interfaces, and a compressive stress acts on the other one of the two interfaces. Specifically, a stress acts on the one interface in a direction in which electric charges generated by polarization are increased, and on the contrary, a stress acts on the other interface in a direction in which electric charges generated by polarization are decreased. Consequently, the amounts of the generated electric charges differ between these interfaces. When force in a thickness direction is applied to the film-like piezoelectric element, stresses which are nearly the same and in the same direction act on the both interfaces, but it is difficult to generate stress which is substantially one obtained when the piezoelectric element is curved. This is because a deformable amount in this direction is small. As a result of conducting earnest studies based on these findings, the inventor of the present application came up with various embodiments.

Hereinafter, embodiments will be concretely described with reference to the attached drawings.

(First Embodiment)

Figure 1:
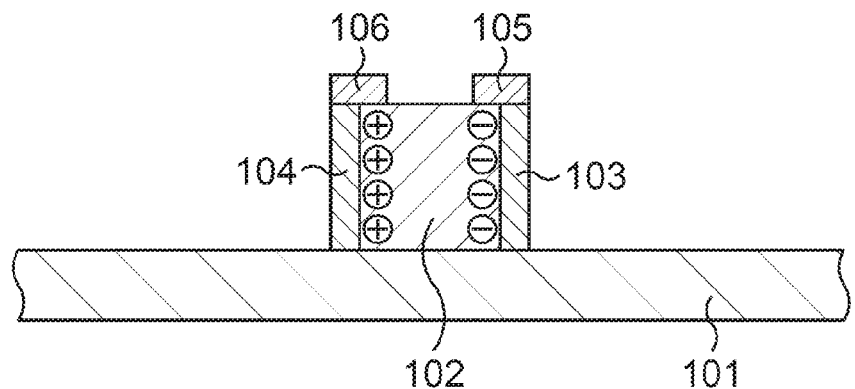
FIG. 1 is a sectional view illustrating a structure of a compound semiconductor device according to a first embodiment.

First, a first embodiment will be described. FIG. 1 is a sectional view illustrating a structure of a compound semiconductor device (piezoelectric element) according to the first embodiment.

As illustrated in FIG. 1, in the compound semiconductor device according to the first embodiment, a nitride semiconductor layer 102 is formed above a surface of a flexible part 101. The nitride semiconductor layer 102 includes a first polar plane and a second polar plane intersecting the surface of the flexible part 101. The compound semiconductor device is provided with a nitride semiconductor layer 103 in contact with the first polar plane of the nitride semiconductor layer 102, and a nitride semiconductor layer 104 in contact with the second polar plane of the nitride semiconductor layer 102. A lattice constant of the nitride semiconductor layer 103 is different from that of the nitride semiconductor layer 102, and a lattice constant of the nitride semiconductor layer 104 is different from that of the nitride semiconductor layer 102. The first polar plane and the second polar plane are planes whose polarities are mutually opposite. Therefore, electric charges generated by polarization of first conductivity type exist on the nitride semiconductor layer 102 side or the nitride semiconductor layer 103 side of an interface between the nitride semiconductor layer 102 and the nitride semiconductor layer 103, here, negative electric charges exist on the nitride semiconductor layer 102 side, and electric charges generated by polarization of second conductivity type exist on the nitride semiconductor layer 102 side or the nitride semiconductor layer 104 side of an interface between the nitride semiconductor layer 102 and the nitride semiconductor layer 104, here, positive electric charges exist on the nitride semiconductor layer 102 side. An ohmic electrode 105 is formed above the interface between the nitride semiconductor layer 102 and the nitride semiconductor layer 103, and an ohmic electrode 106 is formed above the interface between the nitride semiconductor layer 102 and the nitride semiconductor layer 104.

Figure 2:
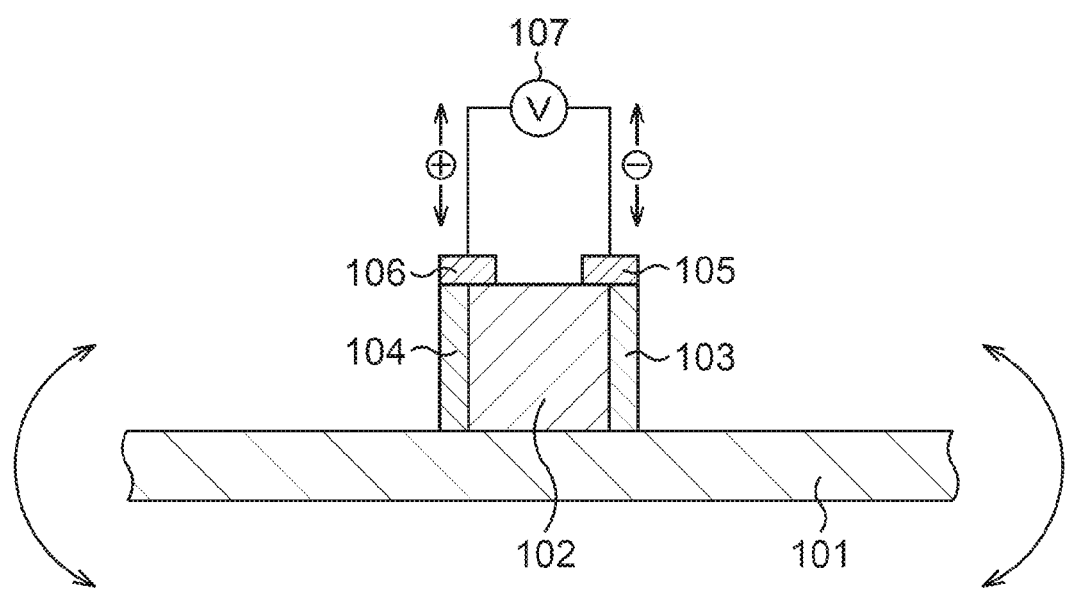
FIG. 2 is a view illustrating an example of using the first embodiment.
Figure 3:
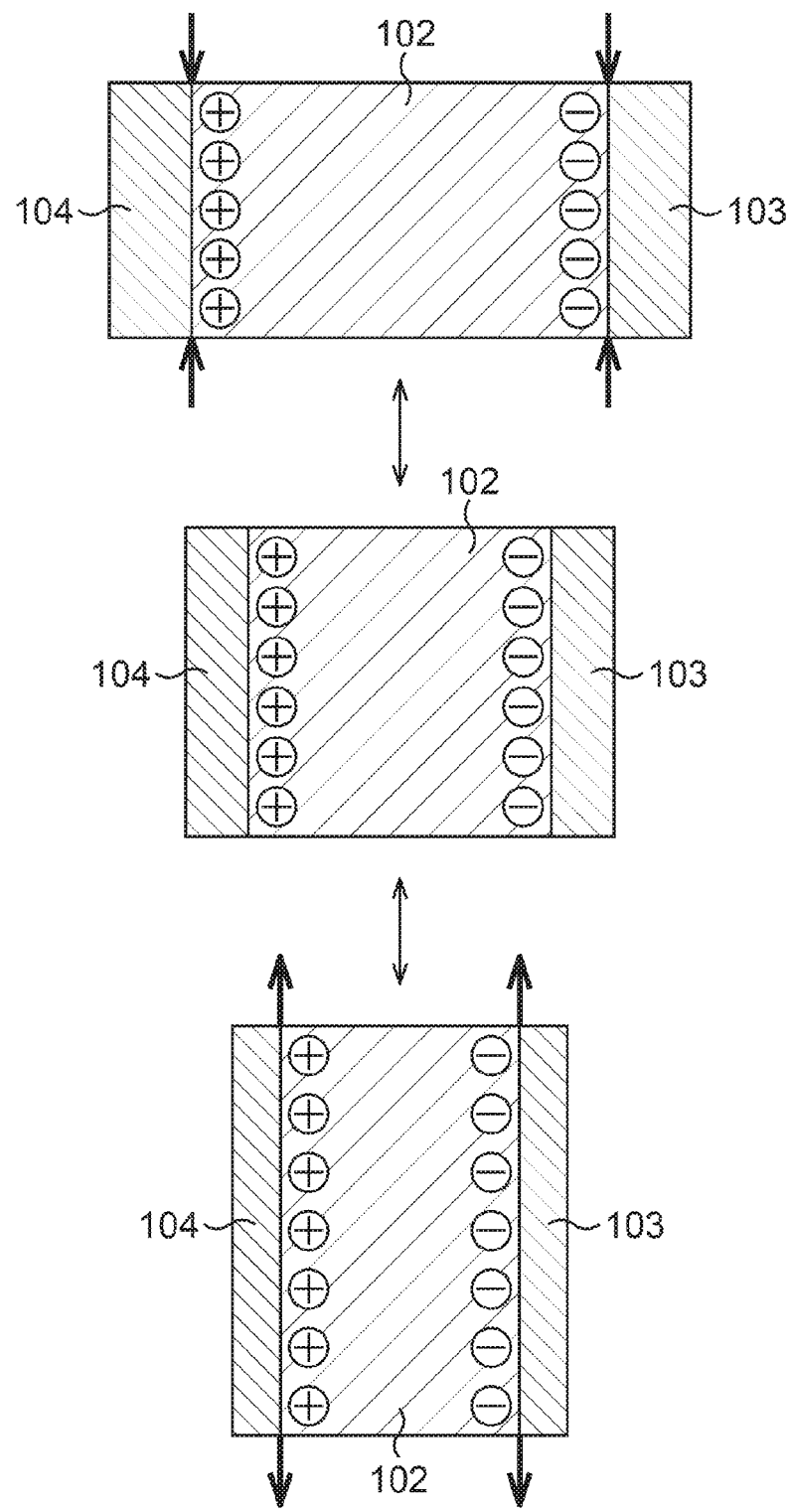
FIG. 3 is a view illustrating deformation of nitride semiconductor layers and a change in an amount of electric charges generated by polarization caused by the deformation.

Next, an operation of the first embodiment will be described. FIG. 2 is a view illustrating an example of using the first embodiment. FIG. 3 is a view illustrating deformation of the nitride semiconductor layers 102 to 104, and a change in an amount of electric charges generated by polarization caused by the deformation. In the example of using the first embodiment, a voltmeter 107 is connected between the ohmic electrode 105 and the ohmic electrode 106.

When the flexible part 101 in a flat state is curved in a direction in which its surface on which the nitride semiconductor layer 102 is provided is stretched, the nitride semiconductor layers 102 to 104 are also deformed in accordance with this, resulting in that a compressive stress acts on the interface between the nitride semiconductor layer 102 and the nitride semiconductor layer 103, and the interface between the nitride semiconductor layer 102 and the nitride semiconductor layer 104 in a direction parallel to these interfaces. As a result, in the vicinity of these interfaces, both of the negative electric charges and the positive electric charges decrease. Specifically, a state illustrated at a center in FIG. 3 changes to a state illustrated on the upper side of FIG. 3. Thereafter, when the state of the flexible part 101 is returned to the flat state from the curved state, the shapes of the nitride semiconductor layers 102 to 104 are returned to their original shapes in accordance with this, resulting in that the compressive stress acting on the interfaces is reduced. As a result, both of the negative electric charges and the positive electric charges increase in the vicinity of these interfaces. A voltage in accordance with the increase and decrease of the negative electric charges and the positive electric charges is generated between the ohmic electrode 105 and the ohmic electrode 106, and the voltage is measured by the voltmeter 107.

When the flexible part 101 in the flat state is curved in a direction in which its surface on which the nitride semiconductor layer 102 is provided is shrunk, the nitride semiconductor layers 102 to 104 are also deformed in accordance with this, resulting in that a tensile stress acts on the interface between the nitride semiconductor layer 102 and the nitride semiconductor layer 103, and the interface between the nitride semiconductor layer 102 and the nitride semiconductor layer 104 in a direction parallel to these interfaces. As a result, in the vicinity of these interfaces, both of the negative electric charges and the positive electric charges increase. Specifically, the state illustrated at the center in FIG. 3 changes to a state illustrated on the lower side of FIG. 3. Thereafter, when the state of the flexible part 101 is returned to the flat state from the curved state, the shapes of the nitride semiconductor layers 102 to 104 are returned to their original shapes in accordance with this, resulting in that the tensile stress acting on the interfaces is reduced. As a result, both of the negative electric charges and the positive electric charges decrease in the vicinity of these interfaces. A voltage in accordance with the increase/decrease of the negative electric charges and the positive electric charges is generated between the ohmic electrode 105 and the ohmic electrode 106, and the voltage is measured by the voltmeter 107.

In the first embodiment, stresses which are nearly the same and mutually in the same direction act on the both interfaces as described above. Further, amount of electric charges generated by polarization changes in accordance with the curvature of the flexible part 101. Therefore, it is possible to impart large deformation, and in addition to that, it is possible to perform power generation with high efficiency accompanied by the deformation.

(Second Embodiment)

Figure 4:
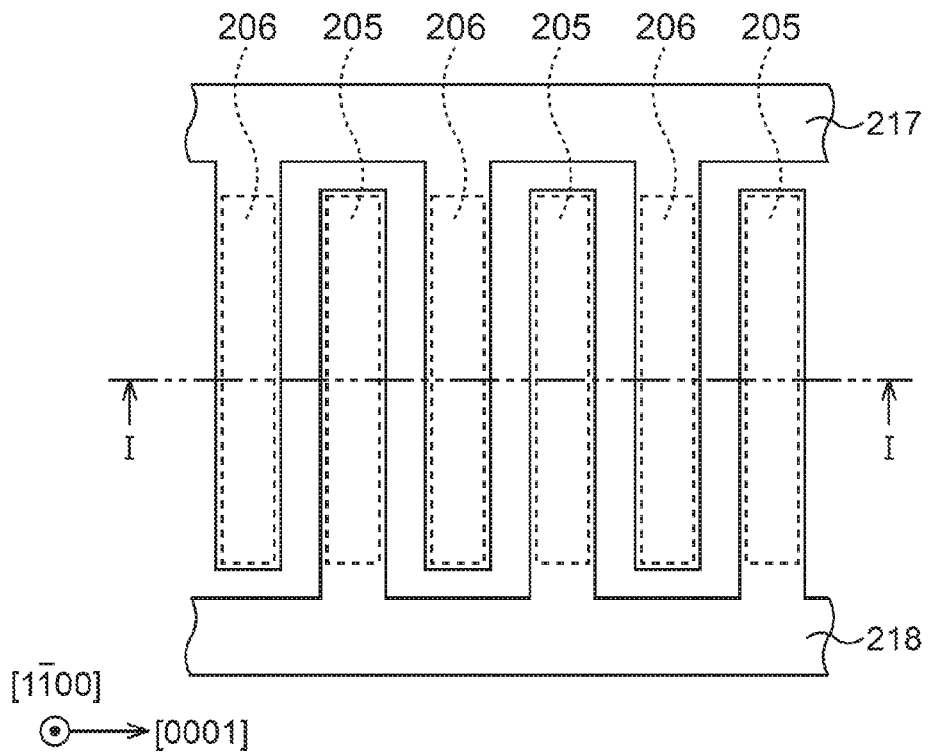
FIG. 4 is a view illustrating a layout of electrodes and wirings of a compound semiconductor device according to a second embodiment.
Figure 5:
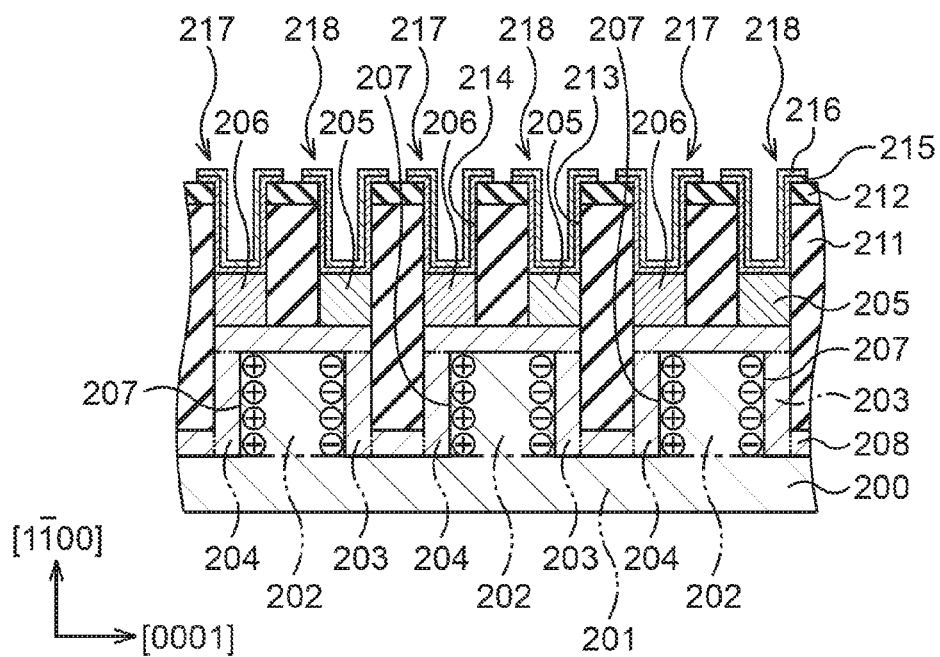
FIG. 5 is a sectional view illustrating a structure of the compound semiconductor device according to the second embodiment.

Next, a second embodiment will be described. FIG. 4 is a view illustrating a layout of electrodes and wirings of a compound semiconductor device (piezoelectric element) according to the second embodiment, and FIG. 5 is a sectional view illustrating a structure of the compound semiconductor device (piezoelectric element) according to the second embodiment. FIG. 5 corresponds to a cross section taken along line I-I in FIG. 4.

As illustrated in FIG. 5, in the second embodiment, a GaN substrate 200 includes a film-like or plate-like flexible part 201, and convex portions 202 above a surface of the flexible part 201. An upper surface of the GaN substrate 200 is a non-polar m-plane, and accordingly, an upper surface of each of the convex portions 202 is also a non-polar m-plane. Each of the convex portions 202 includes two polar planes intersecting the m-plane. A trench 207 is formed between the convex portions 202. One of the polar planes of the convex portion 202 is a Ga polar plane, and the other polar plane is an N polar plane. The m-plane has Miller indices of (1-100), the Ga polar plane has Miller indices of (0001), and the N polar plane has Miller indices of (000-1). An AlGaN layer 208 is formed on the GaN substrate 200, and the AlGaN layer 208 is in contact with the Ga polar planes and the N polar planes of the convex portions 202. Negative electric charges exist, on the Ga polar plane side of the convex portion 202, on the convex portion 202 side of an interface between the convex portion 202 and the AlGaN layer 208, and positive electric charges exist, on the N polar plane side of the convex portion 202, on the convex portion 202 side of an interface between the convex portion 202 and the AlGaN layer 208. For example, the negative electric charge is two-dimensional electron gas (2DEG), and the positive electric charge is two-dimensional hole gas (2DHG). In the second embodiment, the convex portion 202 is an example of the first nitride semiconductor layer, a portion 203 in the AlGaN layer 208, the portion 203 being in contact with the Ga polar plane of the convex portion 202, is an example of the second nitride semiconductor layer, and a portion 204 in the AlGaN layer 208, the portion 204 being in contact with the N polar plane of the convex portion 202, is an example of the third nitride semiconductor layer. The crystal orientations in FIG. 5 indicate crystal orientations of the GaN substrate 200 including the convex portions 202.

An ohmic electrode 205 is formed above the interface between the convex portion 202 and the portion 203, and an ohmic electrode 206 is formed above the interface between the convex portion 202 and the portion 204. The ohmic electrode 205 and the ohmic electrode 206 are on the AlGaN layer 208. An insulating film 211 is formed on the AlGaN layer 208. The insulating film 211 is, for example, a polyimide film. An insulating film 212 is formed on the insulating film 211. The insulting film 212 is, for example, a silicon nitride film. Openings 213 from which the ohmic electrodes 205 are exposed, and openings 214 from which the ohmic electrodes 206 are exposed are formed in the insulating film 211 and the insulating film 212. As illustrated in FIG. 4 as well, a wiring 218 which commonly connects the ohmic electrodes 205, and a wiring 217 which commonly connects the ohmic electrodes 206 are formed. The wiring 217 and the wiring 218 include a seed layer 215 and a plating film 216. A part of the seed layer 215 is in contact with the ohmic electrode 205, another part of the seed layer 215 is in contact with the ohmic electrode 206, and both of the parts are extended up to an upper surface of the insulating film 212. The plating film 216 is formed on the seed layer 215. The crystal orientations in FIG. 4 also indicate the crystal orientations of the GaN substrate 200 including the convex portions 202.

In the second embodiment, when the flexible part 201 is curved, stresses which are nearly the same and mutually in the same direction act on the interface of the convex portion 202 with the portion 203 and the interface of the convex portion 202 with the portion 204. Further, amount of negative electric charges and amount of positive electric charges change at nearly the same level in accordance with the curvature of the flexible part 201. Therefore, it is possible to impart large deformation, and it is possible to perform power generation with high efficiency accompanied by the deformation.

Particularly, in the second embodiment, GaN is used for the convex portion 202, and AlGaN is used for the portion 203 and the portion 204, so that the second embodiment is quite useful for the use at a high temperature. As other materials for piezoelectric element, piezoelectric ceramic such as PZT (lead zirconate titanate: $Pb(Zr,Ti)O_3$) and piezoelectric polymer such as polyvinylidene fluoride (PVDF) are exemplified, and when compared to these materials, the GaN-based nitride semiconductor has quite excellent high-temperature resistance. Further, with the GaN-based nitride semiconductor, a performance index which is excellent when compared to that of PZT and PVDF can also be obtained. Table 1 presents characteristics of these materials.

TABLE 1

|  | GaN | PZT | PVDF |
| --- | --- | --- | --- |
| MELTING POINT (° C.) | EXCEEDING 1000 | 300~330 | 100~150 |
| RELATIVE PERMITTIVITY $\epsilon$ | 9.5 | 1200 | 12 |
| PIEZOELECTRIC CONSTANT $e_{31}$ (C/m$^2$) | 0.34 | 10 | 0.046 |
| PERFORMANCE INDEX $e_{31}/e_0 \epsilon$ (GV/m) | 0.43 | 0.66 | 3.84 |

As an application of the piezoelectric element under the high-temperature environment, direct measurement of a firing pressure of an engine of an automobile is exemplified. If the direct measurement is realized, it is possible to optimize a fuel consumption amount and suppress exhaust gas, to thereby contribute to reduction of an environmental burden. Further, a piezoelectric element may be used for detecting abnormality and the like of members exposed to high temperature in a power station, a chemical factory, and the like. For example, a very small abnormal vibration, elastic wave, acoustic emission and the like caused by a defect and the like inside the members can be detected. By detecting such abnormalities, it is possible to contribute to prevention of accident. In addition, it also becomes possible to carry out new energy harvesting under a high-temperature environment.

PZT is used for a piezoelectric element incorporated in a scanning probe microscope (SPM), for example, PVDF is used for a piezoelectric element for utilizing various energies of fluid, an oscillator, and the like, for example, and a piezoelectric element with GaN-based nitride semiconductor is also suitable for these applications.

Figure 6A:
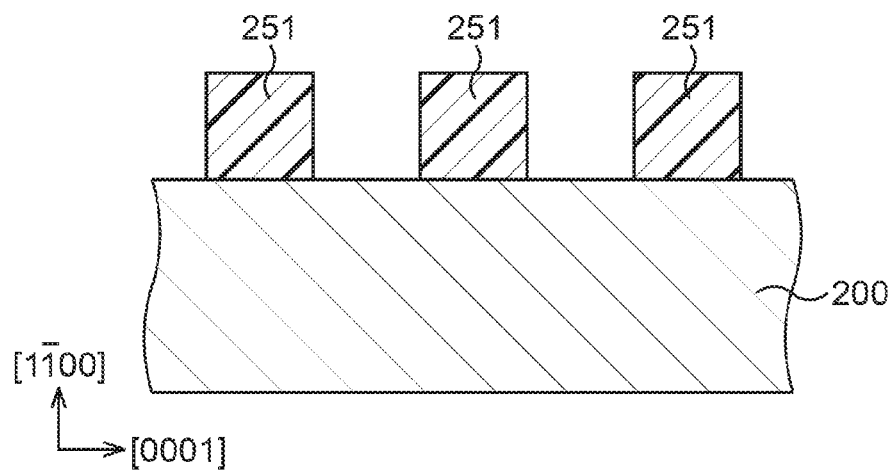
FIG. 6A to FIG. 6O are sectional views illustrating a method of manufacturing the compound semiconductor device according to the second embodiment in order of processes.

Next, a method of manufacturing the compound semiconductor device according to the second embodiment will be described. FIG. 6A to FIG. 6O are sectional views illustrating the method of manufacturing the compound semiconductor device according to the second embodiment in order of processes.

First, a mask 251 of photoresist is formed on the GaN substrate 200 whose upper surface is the m-plane, as illustrated in FIG. 6A. The mask 251 covers a region in which the convex portions 202 are to be formed, and a region in which the trenches 207 are to be formed is exposed from the mask 251. Crystal orientations in FIG. 6A indicate crystal orientations of the GaN substrate 200.

Figure 6B:
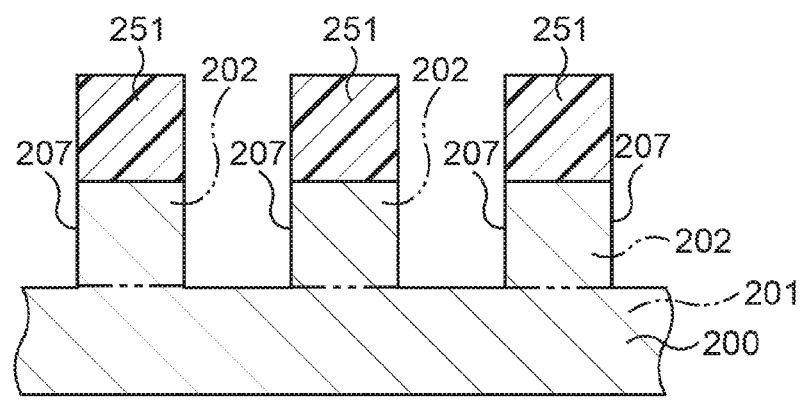

Then, as illustrated in FIG. 6B, the GaN substrate 200 is etched to form the trenches 207 and the convex portions 202. A depth of the trench 207, namely, a height of the convex portion 202 is about 5 µm, for example. Each of a width of the trench 207 and a width of the convex portion 202 is about 5 µm, for example. Dry etching using chlorine gas is conducted as the etching, for example.

Figure 6C:
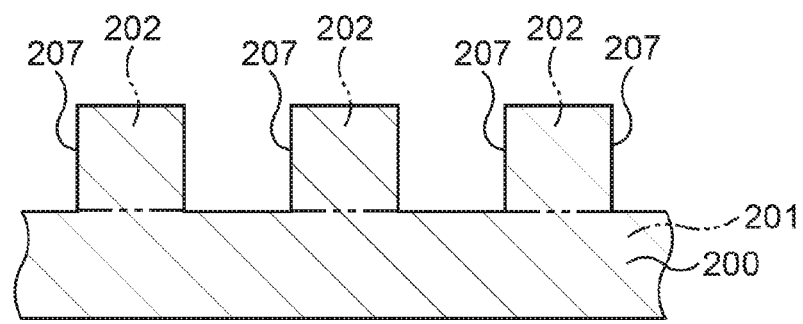

Thereafter, as illustrated in FIG. 6C, the mask 251 is removed, and the GaN substrate 200 is cleaned. In the cleaning, a solution of tetramethylammonium hydride (TMAH) is used, for example.

Figure 6D:
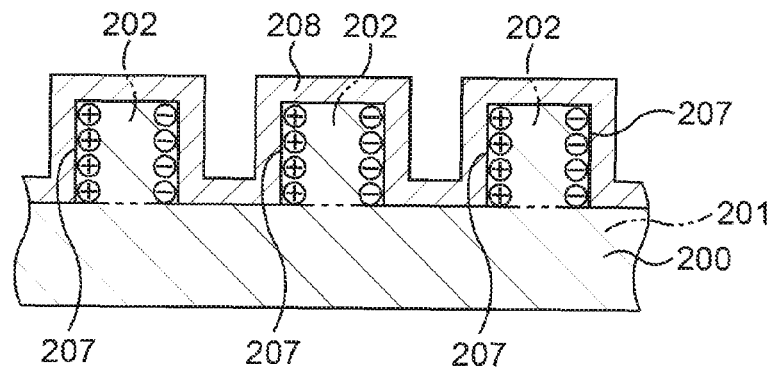

Subsequently, as illustrated in FIG. 6D, the AlGaN layer 208 is formed on the GaN substrate 200. The AlGaN layer 208 may be formed by a plasma-assisted molecular beam epitaxy (PAMBE) method or a metal organic chemical vapor deposition (MOCVD) method in which a temperature of the GaN substrate 200 is about 720° C., for example. For example, an Al composition of the AlGaN layer 208 is about 15% to about 25%, and a thickness of the AlGaN layer 208 is about 25 nm. As a result of the formation of the AlGaN layer 208, 2DEG is generated, on the Ga polar plane side of the convex portion 202, on the convex portion 202 side of the interface between the convex portion 202 and the AlGaN layer 208, and 2DHG is generated, on the N polar plane side of the convex portion 202, on the convex portion 202 side of the interface between the convex portion 202 and the AlGaN layer 208. A GaN layer may be formed before forming the AlGaN layer 208.

Figure 6E:
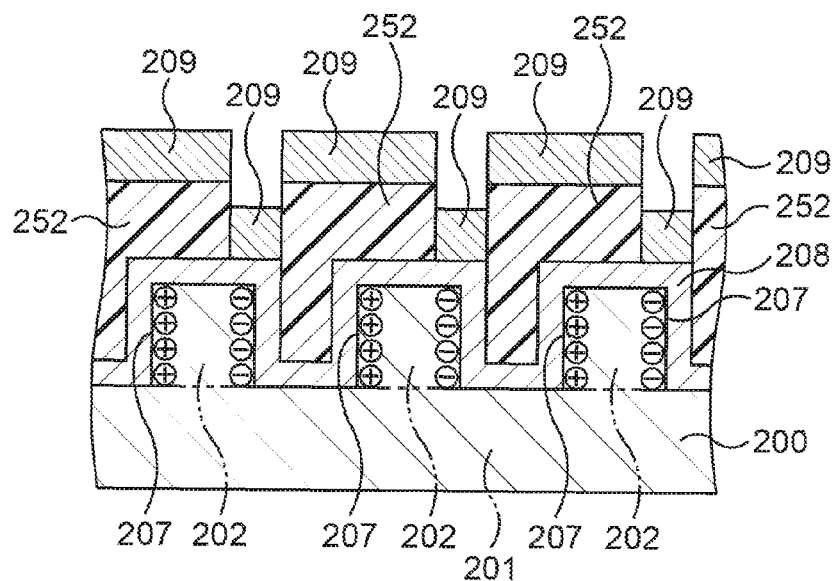

Then, as illustrated in FIG. 6E, a mask 252 of photoresist is formed on the AlGaN layer 208. A region in which the ohmic electrodes 205 are to be formed is exposed from the mask 252. Thereafter, a metal film 209 is formed by a vapor deposition method. In the formation of the metal film 209, for example, a Ti film is formed, and an Al film is formed on the Ti film.

Figure 6F:
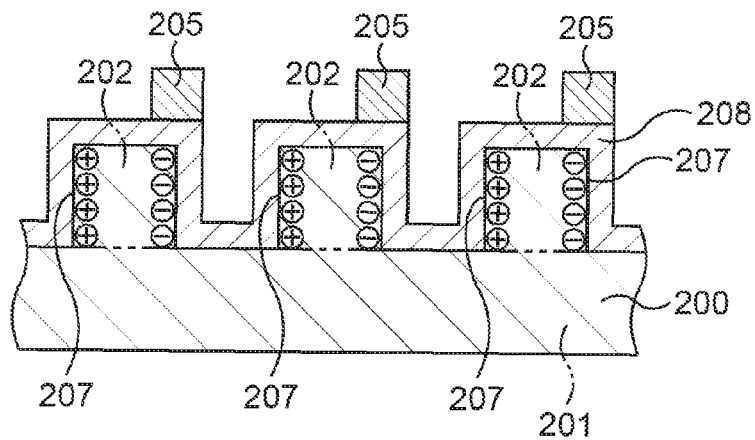

Subsequently, as illustrated in FIG. 6F, the mask 252 is removed together with a part of the metal film 209 disposed on the mask 252. Specifically, a lift-off method is used to make a part of the metal film 209 remain on the AlGaN layer 208. Then, heat treatment is conducted so that the metal film 209 is in ohmic contact with the AlGaN layer 208 and the convex portions 202. As a result, the ohmic electrodes 205 functioning as negative electrodes can be obtained. Rapid thermal annealing (RTA) at about 600° C. is conducted as the heat treatment, for example.

Figure 6G:
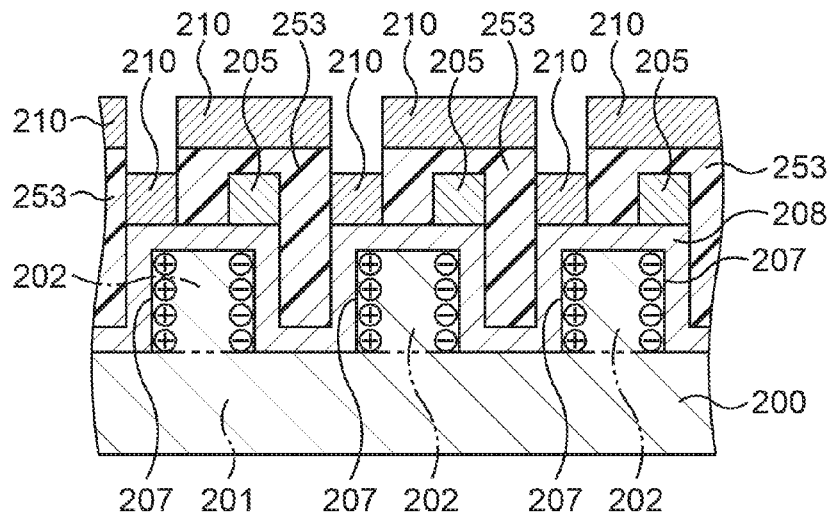

Thereafter, as illustrated in FIG. 6G, a mask 253 of photoresist is formed on the AlGaN layer 208. A region in which the ohmic electrodes 206 are to be formed is exposed from the mask 253. Subsequently, a metal film 210 is formed by a vapor deposition method. In the formation of the metal film 210, for example, a Ni film is formed, and an Au film is formed on the Ni film.

Figure 6H:
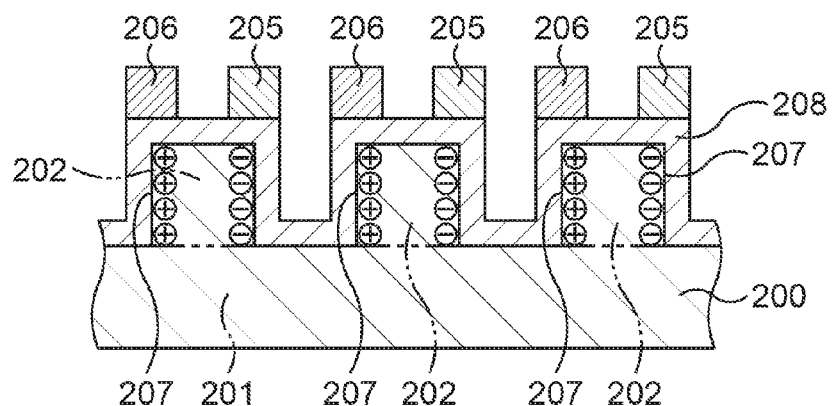

Then, as illustrated in FIG. 6H, the mask 253 is removed together with a part of the metal film 210 disposed on the mask 253. Specifically, a lift-off method is used to make a part of the metal film 210 remain on the AlGaN layer 208. As a result, the ohmic electrodes 206 functioning as positive electrodes can be obtained. Heat treatment may be conducted at about 400° C. for about five minutes in order to further improve ohmic properties of the ohmic electrodes 206, for example.

Figure 6I:
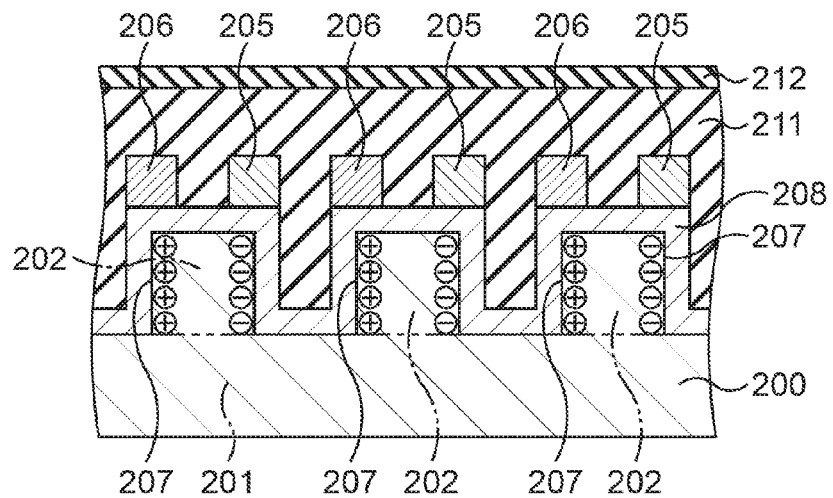

Thereafter, as illustrated in FIG. 6I, the insulating film 211 covering the ohmic electrodes 205 and the ohmic electrodes 206 is formed on the AlGaN layer 208, and the insulating film 212 is formed on the insulating film 211. A polyimide film is formed as the insulating film 211, for example, and a silicon nitride film is formed as the insulating film 212, for example. The polyimide film may be formed by a coating method, and the silicon nitride film may be formed by a deposition method.

Figure 6J:
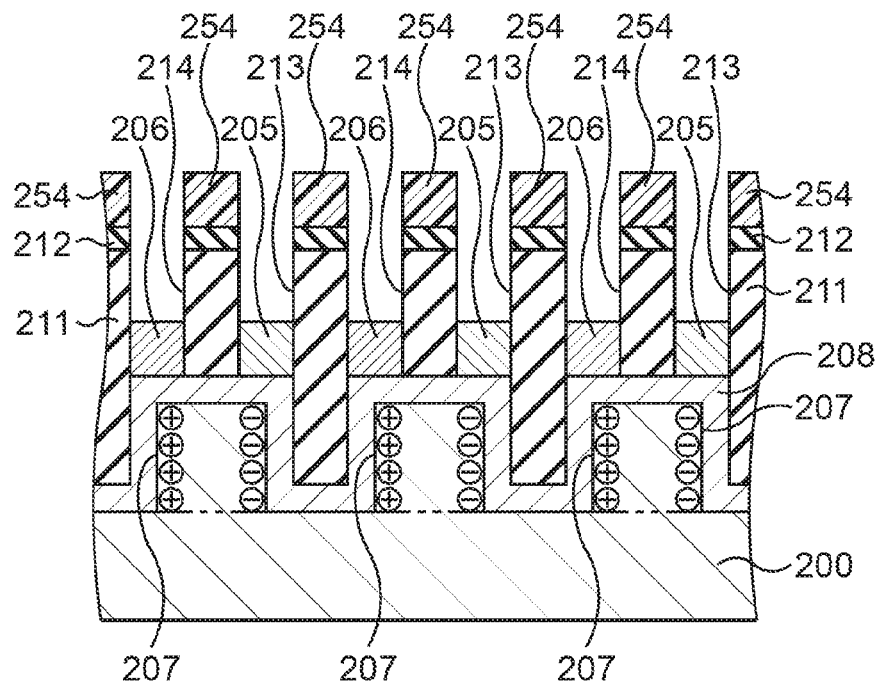

Subsequently, as illustrated in FIG. 6J, a mask 254 of photoresist is formed on the insulating film 212. A region in which the openings 213 are to be formed and a region in which the openings 214 are to be formed are exposed from the mask 254. Then, the insulating film 212 and the insulating film 211 are etched to form the openings 213 and the openings 214. Dry etching is conducted as the etching, for example.

Figure 6K:
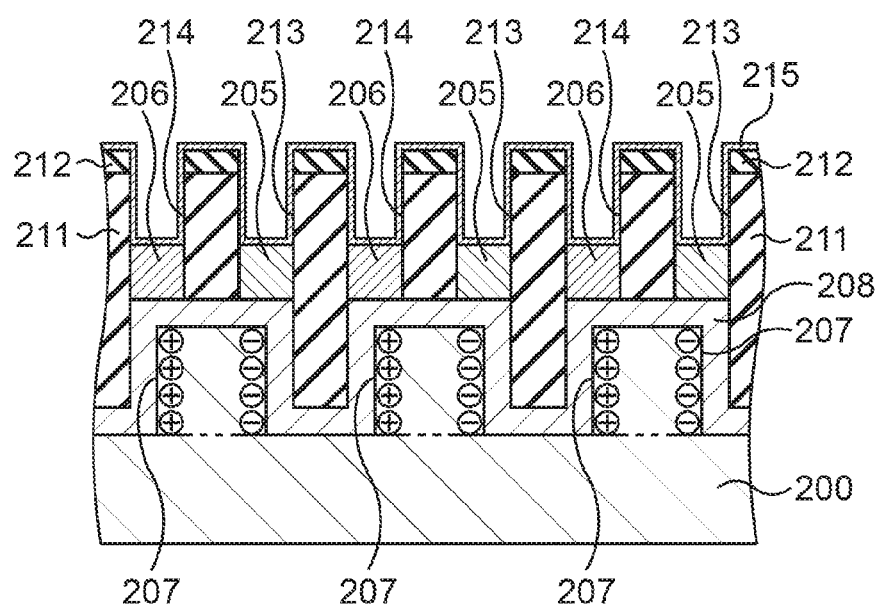

Thereafter, as illustrated in FIG. 6K, the mask 254 is removed. Subsequently, the seed layer 215 is formed in the openings 213, in the openings 214, and on the insulating film 212 by sputtering. In the formation of the seed layer 215, for example, a Ti film is formed, and an Au film is formed on the Ti film.

Figure 6L:
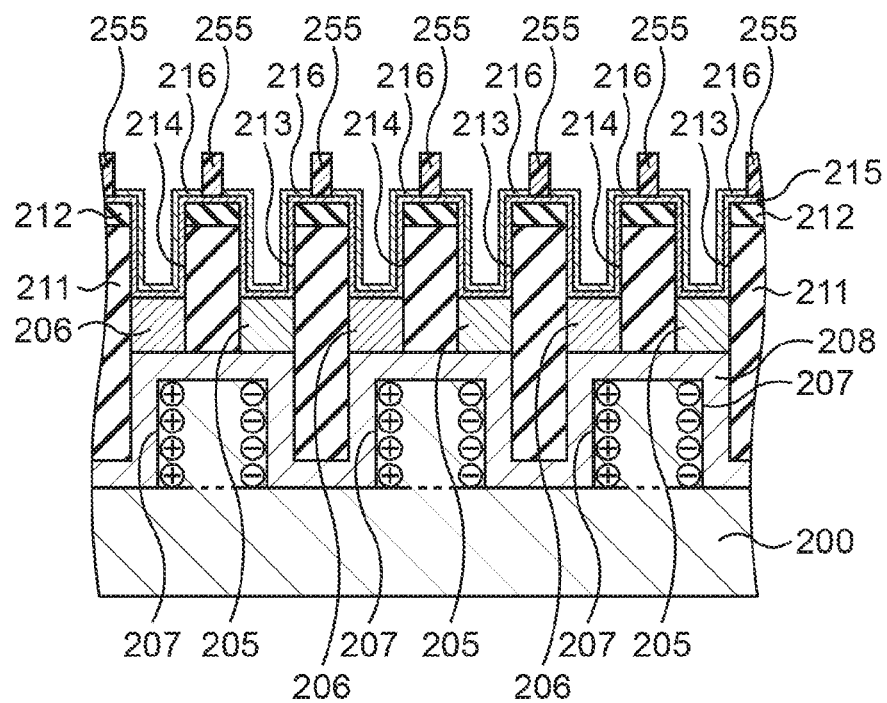

Then, as illustrated in FIG. 6L, a mask 255 of photoresist is formed on the seed layer 215. A region in which the plating film 216 is to be formed is exposed from the mask 255. Thereafter, the plating film 216 is formed on a portion of the seed layer 215 exposed from the mask 255. In the formation of the plating film 216, for example, an Au plating film is formed, and a Ni plating film is formed on the Au plating film.

Figure 6M:
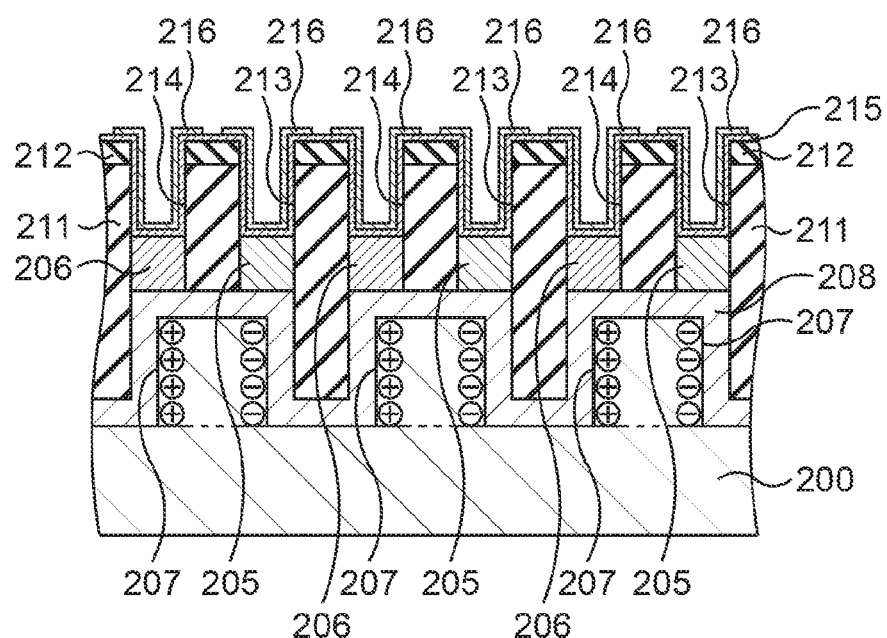

Subsequently, the mask 255 is removed, as illustrated in FIG. 6M.

Figure 6N:
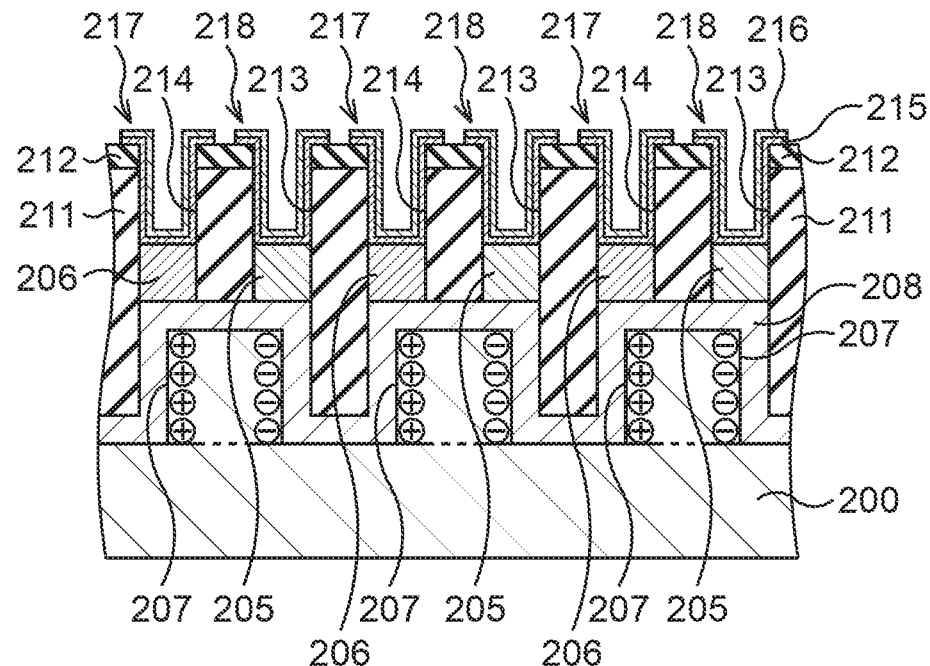
Figure 6O:
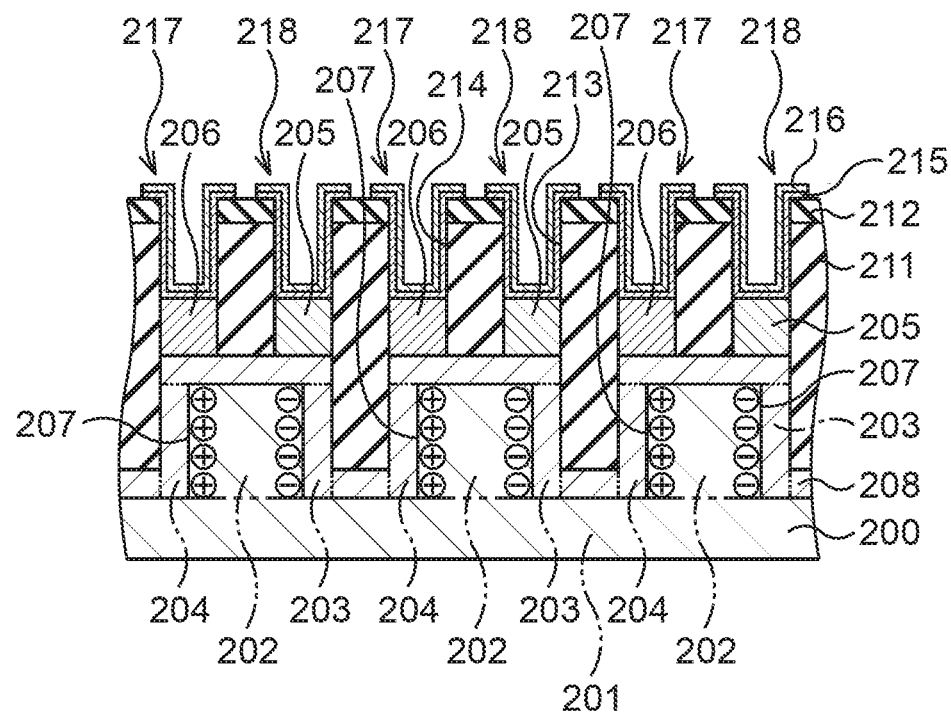

Then, as illustrated in FIG. 6N, a portion of the seed layer 215 exposed from the plating film 216 is removed. The seed layer 215 may be removed by ion milling, for example. As a result, the wiring 217 including a part of the seed layer 215 and the plating film 216, and the wiring 218 including another part of the seed layer 215 and the plating film 216 can be obtained.

Thereafter, the GaN substrate 200 is thinned, as illustrated in FIG. 6O. The thickness of the thinned GaN substrate 200 is about 10 µm, for example. When the GaN substrate 200 is thinned, a protective film or the like such as a polyimide film covering the plating film 216, the insulating film 212 and the like is previously formed. The GaN substrate 200 may be thinned by mechanical polishing, wet etching, dry etching, or the like, for example. The thinned GaN substrate 200 is preferably further thinned for obtaining higher flexibility, and is preferably further thickened for securing higher strength, and the thickness of the thinned GaN substrate 200 may be controlled with taking these into consideration.

The upper surface of the convex portion 202 may be not the m-plane but be an a-plane. The a-plane has Miller indices of (11-20). The upper surface of the convex portion 202 may be a non-polar plane other than the m-plane and the a-plane. As long as the Ga polar plane and the N polar plane of the convex portion 202 are exposed so as to intersect the surface of the flexible part 201, desired function may be obtained. For example, when a GaN substrate whose upper surface is an a-plane is used, instead of the GaN substrate 200 whose upper surface is the m-plane, the upper surface of the convex portion 202 may be the a-plane.

(Third Embodiment)

Figure 7:
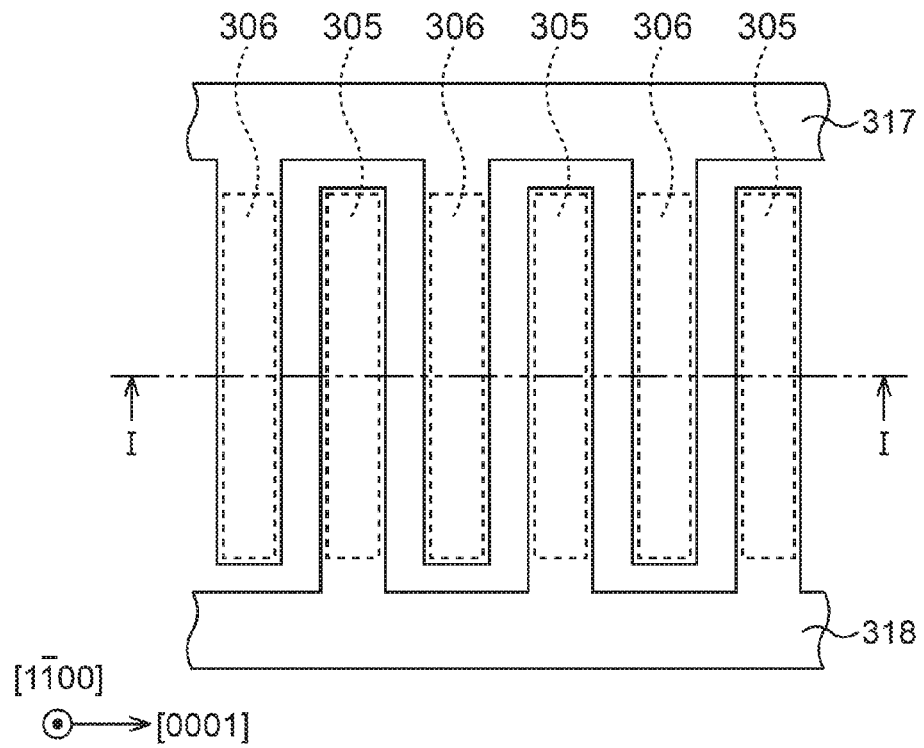
FIG. 7 is a view illustrating a layout of electrodes and wirings of a compound semiconductor device according to a third embodiment.
Figure 8:
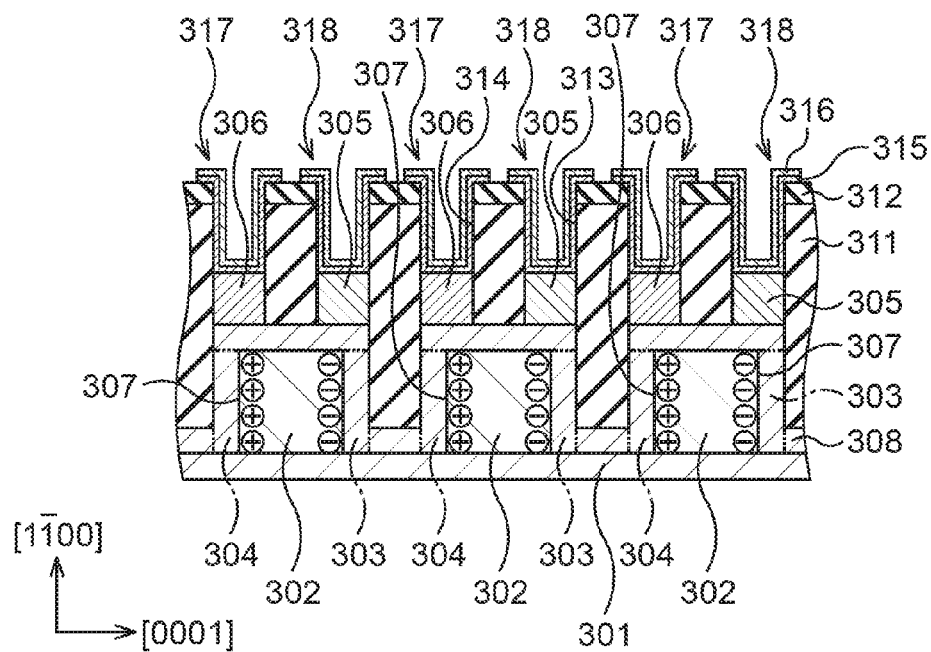
FIG. 8 is a sectional view illustrating a structure of the compound semiconductor device according to the third embodiment.

Next, a third embodiment will be described. FIG. 7 is a view illustrating a layout of electrodes and wirings of a compound semiconductor device (piezoelectric element) according to the third embodiment, and FIG. 8 is a sectional view illustrating a structure of the compound semiconductor device (piezoelectric element) according to the third embodiment. FIG. 8 corresponds to a cross section taken along line I-I in FIG. 7.

As illustrated in FIG. 8, in the third embodiment, convex portions 302 of GaN are provided above a surface of a film-like or plate-like flexible part 301 of GaN. An upper surface of each of the convex portions 302 is a non-polar m-plane. Each of the convex portions 302 includes two polar planes intersecting the m-plane. A trench 307 is formed between the convex portions 302. One of the polar planes of the convex portion 302 is a Ga polar plane, and the other polar plane is an N polar plane. An AlGaN layer 308 is formed on the flexible part 301 and the convex portions 302, and the AlGaN layer 308 is in contact with the Ga polar planes and the N polar planes of the convex portions 302. Further, negative electric charges exist, on the Ga polar plane side of the convex portion 302, on the convex portion 302 side of an interface between the convex portion 302 and the AlGaN layer 308, and positive electric charges exist, on the N polar plane side of the convex portion 302, on the convex portion 302 side of an interface between the convex portion 302 and the AlGaN layer 308. For example, the negative electric charge is 2DEG, and the positive electric charge is 2DHG. In the third embodiment, the convex portion 302 is an example of the first nitride semiconductor layer, a portion 303 in the AlGaN layer 308, the portion 303 being in contact with the Ga polar plane of the convex portion 302, is an example of the second nitride semiconductor layer, and a portion 304 in the AlGaN layer 308, the portion 304 being in contact with the N polar plane of the convex portion 302, is an example of the third nitride semiconductor layer. The crystal orientations in FIG. 8 indicate crystal orientations of the convex portions 302.

An ohmic electrode 305 is formed above the interface between the convex portion 302 and the portion 303, and an ohmic electrode 306 is formed above the interface between the convex portion 302 and the portion 304. The ohmic electrode 305 and the ohmic electrode 306 are on the AlGaN layer 308. An insulating film 311 is formed on the AlGaN layer 308. The insulating film 311 is, for example, a polyimide film. An insulating film 312 is formed on the insulating film 311. The insulting film 312 is, for example, a silicon nitride film. Openings 313 from which the ohmic electrodes 305 are exposed, and openings 314 from which the ohmic electrodes 306 are exposed are formed in the insulating film 311 and the insulating film 312. As illustrated in FIG. 7 as well, a wiring 318 which commonly connects the ohmic electrodes 305, and a wiring 317 which commonly connects the ohmic electrodes 306 are formed. The wiring 317 and the wiring 318 include a seed layer 315 and a plating film 316. A part of the seed layer 315 is in contact with the ohmic electrode 305, another part of the seed layer 315 is in contact with the ohmic electrode 306, and both of the parts are extended up to an upper surface of the insulating film 312. The plating film 316 is formed on the seed layer 315. The crystal orientations in FIG. 7 also indicate the crystal orientations of the convex portions 302.

In the third embodiment, when the flexible part 301 is curved, stresses which are nearly the same and mutually in the same direction act on the interface of the convex portion 302 with the portion 303 and the interface of the convex portion 302 with the portion 304. Further, the amount of negative electric charges and the amount of positive electric charges change at nearly the same level in accordance with the curvature of the flexible part 301. Therefore, in a similar manner to the second embodiment, it is possible to impart large deformation, and it is possible to perform power generation with high efficiency accompanied by the deformation. Further, the third embodiment is also quite useful for the use at a high temperature.

Figure 9A:
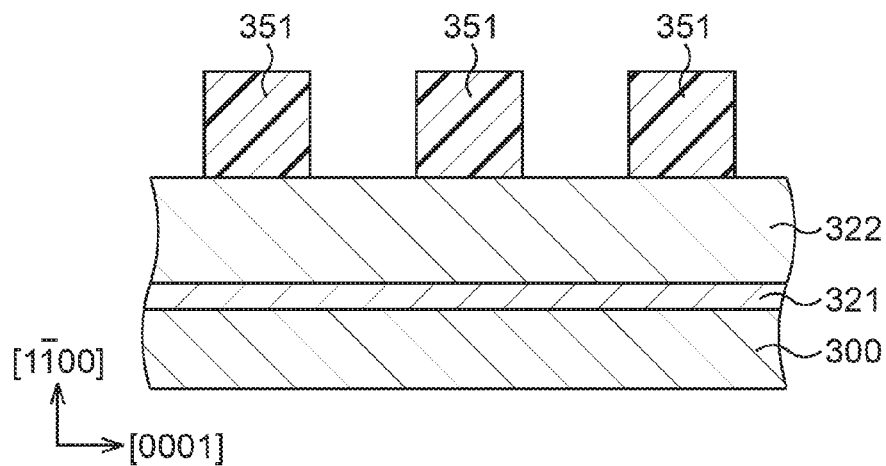
FIG. 9A to FIG. 9O are sectional views illustrating a method of manufacturing the compound semiconductor device according to the third embodiment in order of processes.

Next, a method of manufacturing the compound semiconductor device according to the third embodiment will be described. FIG. 9A to FIG. 9O are sectional views illustrating the method of manufacturing the compound semiconductor device according to the third embodiment in order of processes.

First, a GaN-based buffer layer 321 and a GaN layer 322 whose upper surface is an m-plane are formed on a substrate 300, as illustrated in FIG. 9A. A sapphire substrate whose upper surface is an m-plane is used as the substrate 300, for example. Then, a mask 351 of photoresist is formed on the GaN layer 322. The mask 351 covers a region in which the convex portions 302 are to be formed, and a region in which the trenches 307 are to be formed is exposed from the mask 351. The crystal orientations in FIG. 9A indicate crystal orientations of the GaN layer 322.

Figure 9B:
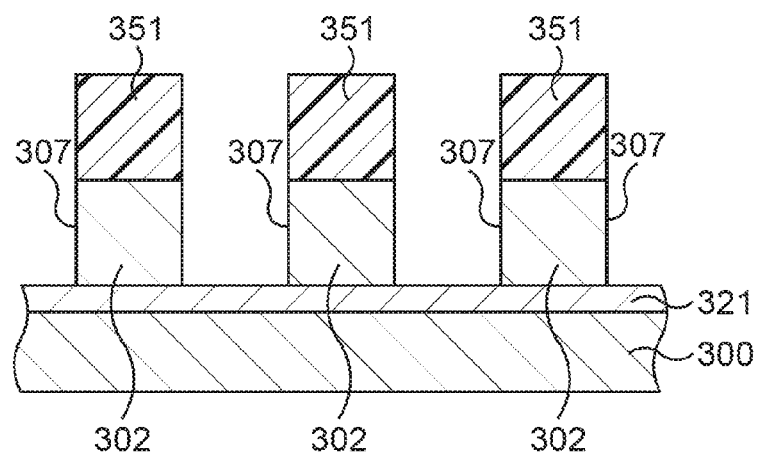

Thereafter, as illustrated in FIG. 9B, the GaN layer 322 is etched to form the trenches 307 and the convex portions 302. A depth of the trench 307, namely, a height of the convex portion 302 is about 5 μm, for example. Each of a width of the trench 307 and a width of the convex portion 302 is about 5 μm, for example. Dry etching using chlorine gas is conducted as the etching, for example.

Figure 9C:
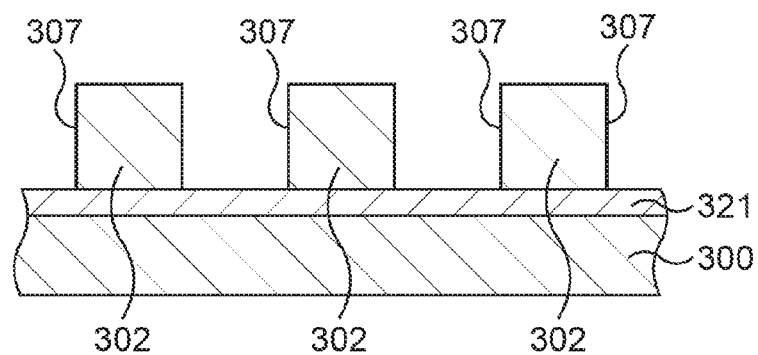

Subsequently, as illustrated in FIG. 9C, the mask 351 is removed, and the substrate 300, the buffer layer 321, and the convex portions 302 are cleaned. In the cleaning, a solution of TMAH is used, for example.

Figure 9D:
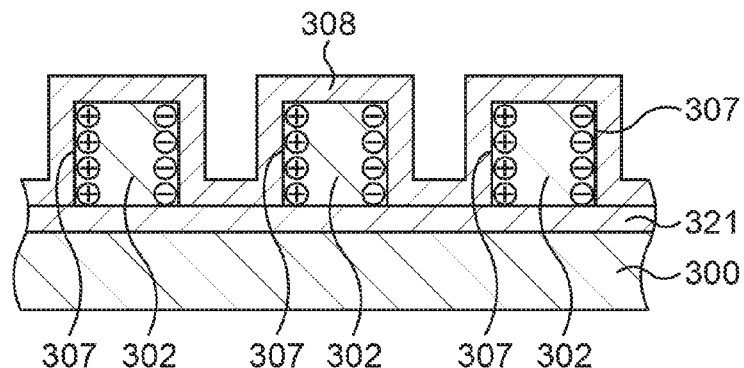

Then, as illustrated in FIG. 9D, the AlGaN layer 308 is formed on the buffer layer 321 and the convex portions 302. The AlGaN layer 308 may be formed by a PAMBE method or an MOCVD method, for example in which a temperature of the substrate 300 is about 720° C. For example, an Al composition of the AlGaN layer 308 is about 15% to about 25%, and a thickness of the AlGaN layer 308 is about 25 nm. As a result of the formation of the AlGaN layer 308, 2DEG is generated, on the Ga polar plane side of the convex portion 302, on the convex portion 302 side of the interface between the convex portion 302 and the AlGaN layer 308, and 2DHG is generated, on the N polar plane side of the convex portion 302, on the convex portion 302 side of the interface between the convex portion 302 and the AlGaN layer 308. A GaN layer may be formed before forming the AlGaN layer 308.

Figure 9E:
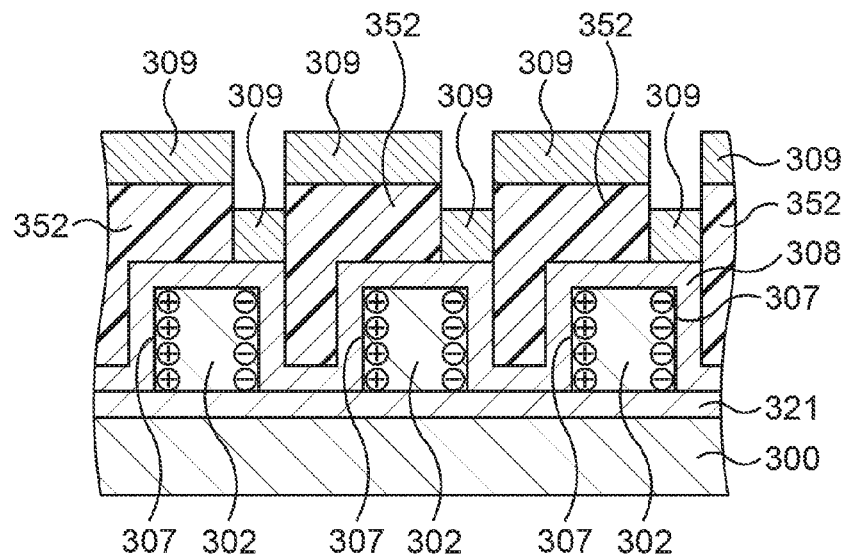

Thereafter, as illustrated in FIG. 9E, a mask 352 of photoresist is formed on the AlGaN layer 308. A region in which the ohmic electrodes 305 are to be formed is exposed from the mask 352. Subsequently, a metal film 309 is formed by a vapor deposition method. In the formation of the metal film 309, for example, a Ti film is formed, and an Al film is formed on the Ti film.

Figure 9F:
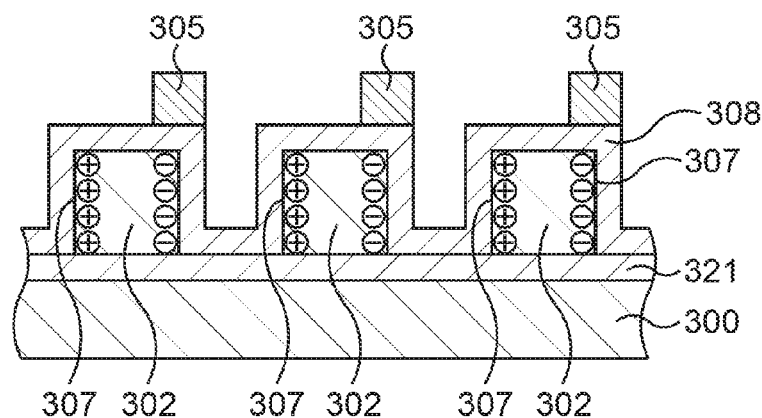

Then, as illustrated in FIG. 9F, the mask 352 is removed together with a part of the metal film 309 disposed on the mask 352. Specifically, a lift-off method is used to make a part of the metal film 309 remain on the AlGaN layer 308. Thereafter, heat treatment is conducted so that the metal film 309 is in ohmic contact with the AlGaN layer 308 and the convex portions 302. As a result, the ohmic electrodes 305 functioning as negative electrodes can be obtained. RTA at about 600° C. is conducted as the heat treatment, for example.

Figure 9G:
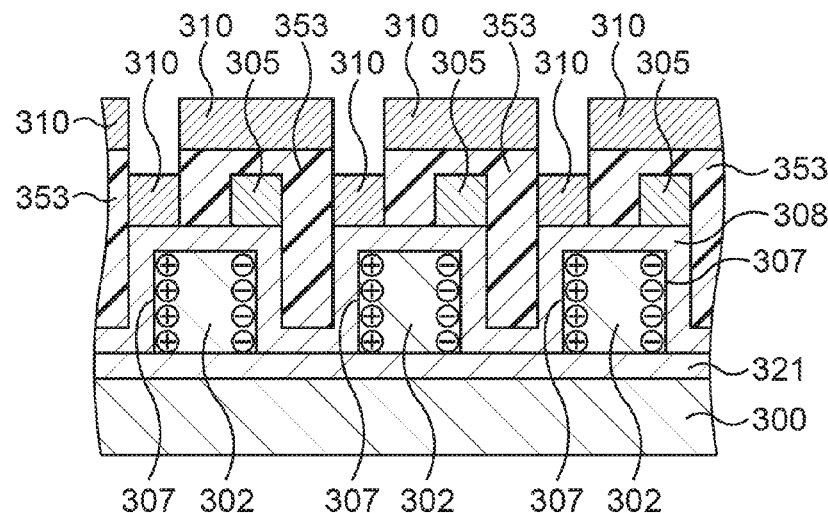

Subsequently, as illustrated in FIG. 9G, a mask 353 of photoresist is formed on the AlGaN layer 308. A region in which the ohmic electrodes 306 are to be formed is exposed from the mask 353. Then, a metal film 310 is formed by a vapor deposition method. In the formation of the metal film 310, for example, a Ni film is formed, and an Au film is formed on the Ni film.

Figure 9H:
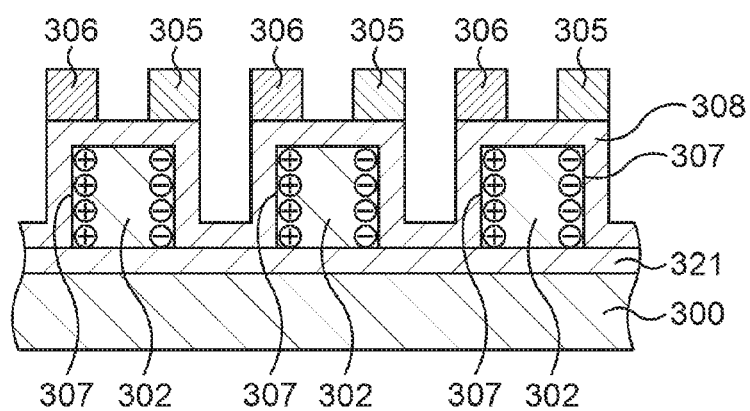

Thereafter, as illustrated in FIG. 9H, the mask 353 is removed together with a part of the metal film 310 disposed on the mask 353. Specifically, a lift-off method is used to make a part of the metal film 310 remain on the AlGaN layer 308. As a result, the ohmic electrodes 306 each functioning as positive electrodes can be obtained. Heat treatment may be conducted at about 400° C. for about five minutes in order to further improve ohmic properties of the ohmic electrodes 306, for example.

Figure 9I:
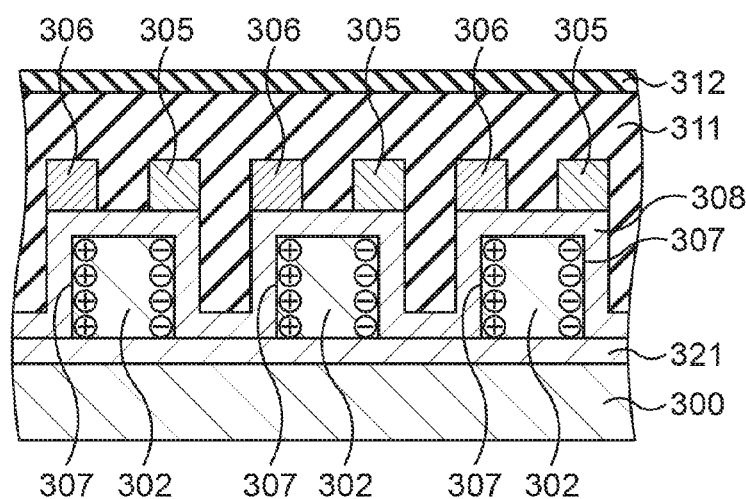

Subsequently, as illustrated in FIG. 9I, the insulating film 311 covering the ohmic electrodes 305 and the ohmic electrodes 306 is formed on the AlGaN layer 308, and the insulating film 312 is formed on the insulating film 311. A polyimide film is formed as the insulating film 311, for example, and a silicon nitride film is formed as the insulating film 312, for example. The polyimide film may be formed by a coating method, and the silicon nitride film may be formed by a deposition method.

Figure 9J:
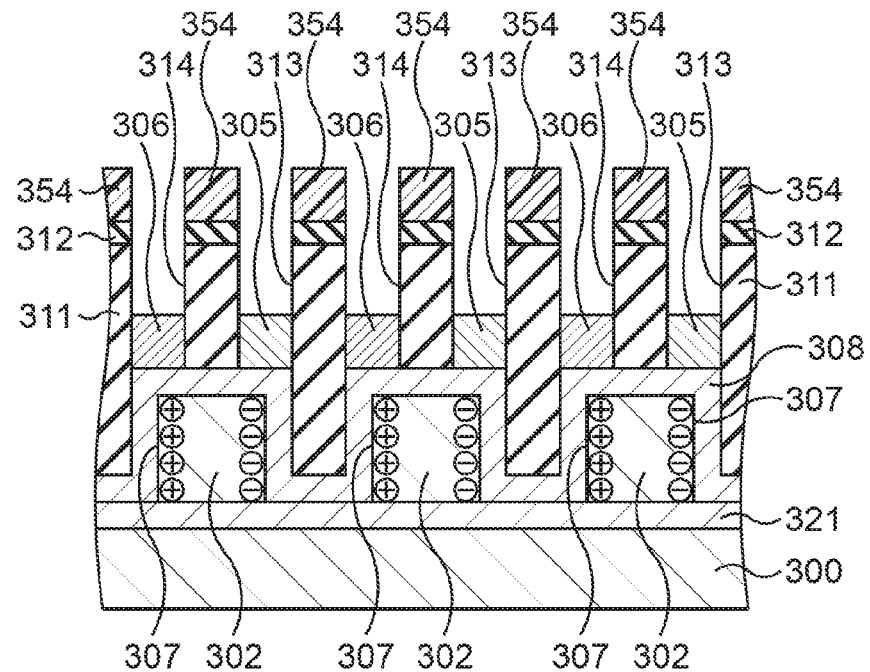

Then, as illustrated in FIG. 9J, a mask 354 of photoresist is formed on the insulating film 312. A region in which the openings 313 are to be formed and a region in which the openings 314 are to be formed are exposed from the mask 354. Thereafter, the insulating film 312 and the insulating film 311 are etched to form the openings 313 and the openings 314. Dry etching is conducted as the etching, for example.

Figure 9K:
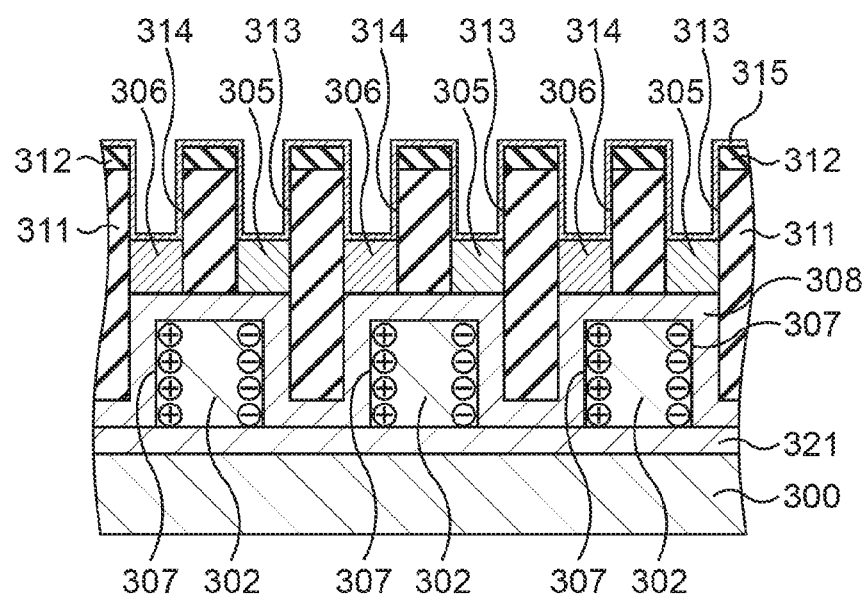

Subsequently, as illustrated in FIG. 9K, the mask 354 is removed. Then, the seed layer 315 is formed in the openings 313, in the openings 314, and on the insulating film 312 by sputtering. In the formation of the seed layer 315, for example, a Ti film is formed, and an Au film is formed on the Ti film.

Figure 9L:
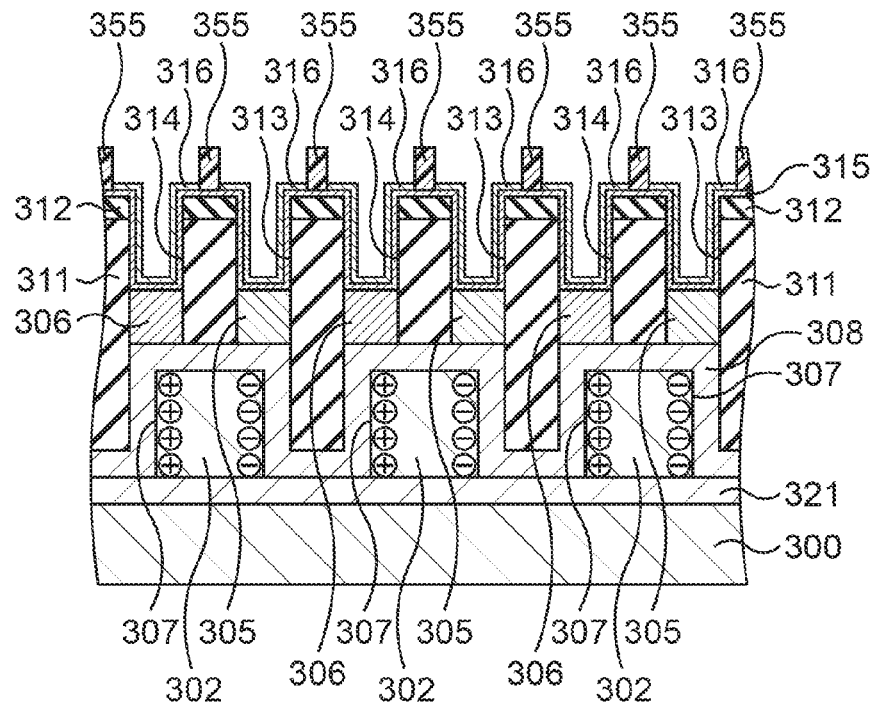

Thereafter, as illustrated in FIG. 9L, a mask 355 of photoresist is formed on the seed layer 315. A region in which the plating film 316 is to be formed is exposed from the mask 355. Subsequently, the plating film 316 is formed on a portion of the seed layer 315 exposed from the mask 355. In the formation of the plating film 316, for example, an Au plating film is formed, and a Ni plating film is formed on the Au plating film.

Figure 9M:
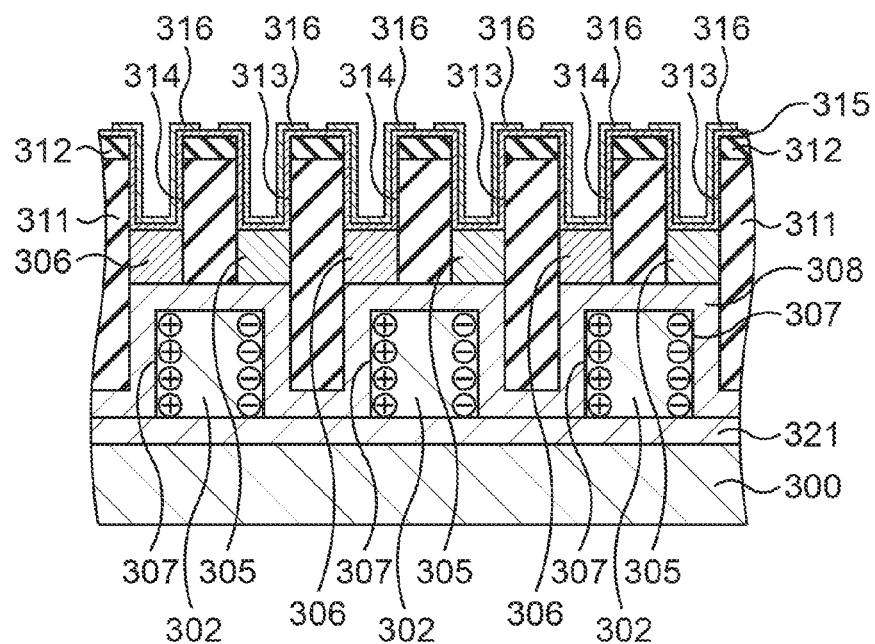

Then, the mask 355 is removed, as illustrated in FIG. 9M.

Figure 9N:
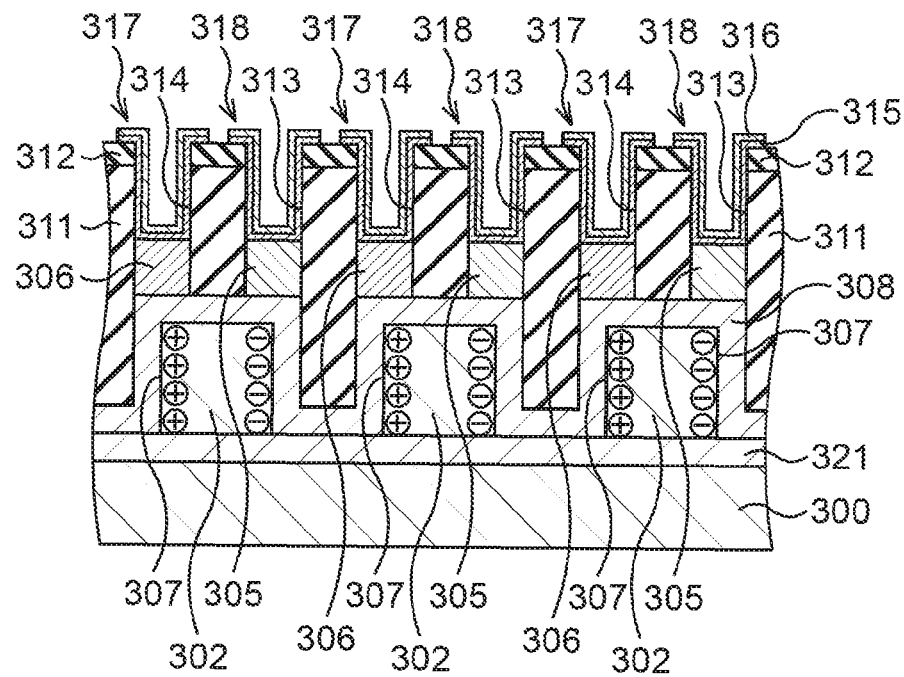
Figure 9O:
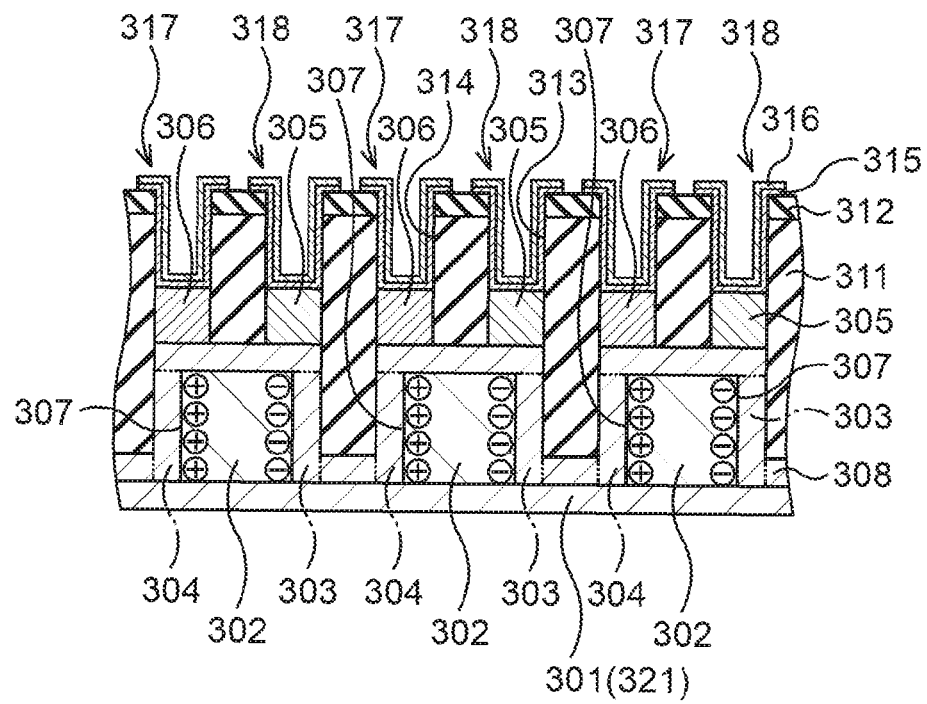

Thereafter, as illustrated in FIG. 9N, a portion of the seed layer 315 exposed from the plating film 316 is removed. The seed layer 315 may be removed by ion milling, for example. As a result, the wiring 317 including a part of the seed layer 315 and the plating film 316, and the wiring 318 including another part of the seed layer 315 and the plating film 316 can be obtained.

Subsequently, the substrate 300 is removed from the buffer layer 321, as illustrated in FIG. 9O. When the substrate 300 is removed, a protective film or the like such as a polyimide film covering the plating film 316, the insulating film 312 and the like is previously formed. The substrate 300 may be removed by irradiation of laser light, mechanical polishing, wet etching, dry etching, or the like, for example. The buffer layer 321 functions as the flexible part 301. The flexible part 301 (buffer layer 321) is preferably further thinned for obtaining higher flexibility, and is preferably further thickened for securing higher strength, and the thickness of the flexible part 301 (buffer layer 321) may be controlled with taking these into consideration.

In the third embodiment, the substrate 300 which is less expensive than the GaN substrate can be used. Therefore, the third embodiment can reduce manufacturing cost, when compared to the second embodiment.

The upper surface of the convex portion 302 may be not the m-plane but be an a-plane. The upper surface of the convex portion 302 may be a non-polar plane other than the m-plane and the a-plane. As long as the Ga polar plane and the N polar plane of the convex portion 302 are exposed so as to intersect the surface of the flexible part 301, desired function can be obtained. For example, when a sapphire substrate whose upper surface is an r-plane is used, as the substrate 300, instead of the sapphire substrate whose upper surface is the m-plane, the GaN layer 322 whose upper surface is the a-plane may be formed and the upper surface of the convex portion 302 may be the a-plane.

Even if a SiC substrate whose upper surface is the m-plane, a γ-LiAlO$_2$ substrate whose upper surface has Miller indices of (100), a ZnO substrate whose upper surface is an m-plane, a patterned sapphire substrate whose upper surface is an a-plane, or a patterned Si substrate whose upper surface has Miller indices of (112) is used as the substrate 300, the convex portion 302 with the upper surface of the m-plane may be obtained. These substrates are described in, for example, "Gardner et al., Appl. Phys. Lett. 86 (2005) 111101", "Waltereit et al., J. Cryst. Growth 218 (2000) 143", "Kobayashi et al., Appl. Phys. Lett. 90 (2007) 041908", "Armitage et al., Appl. Phys. Lett. 92 (2008) 092121", "Okuno et al., Appl. Phys. Express 2 (2009) 031002", and "Ni et al., Appl. Phys. Lett. 95 (2009) 111102". Even if an AlN substrate whose upper surface is an m-plane is used as the substrate 300, the convex portion 302 with the upper surface of the m-plane may be obtained.

Even if a sapphire substrate whose upper surface is an r-plane, a LiGaO$_2$ substrate whose upper surface has Miller indices of (010), or a SiC substrate whose upper surface is an a-plane is used as the substrate 300, the convex portion 302 with the upper surface of the a-plane may be obtained. These substrates are described in, for example, "Kuroda et al., J. Appl. Phys. 102 (2007) 093703", "Schuber et al., AIP Conf. Proc. 1399 (2011) 191", and "Craven et al., Appl. Phys. Lett. 84 (2004) 1281". Even if an AlN substrate or a ZnO substrate whose upper surface is an a-plane is used as the substrate 300, the convex portion 302 with the upper surface of the a-plane may be obtained.

(Fourth Embodiment)

Figure 10:
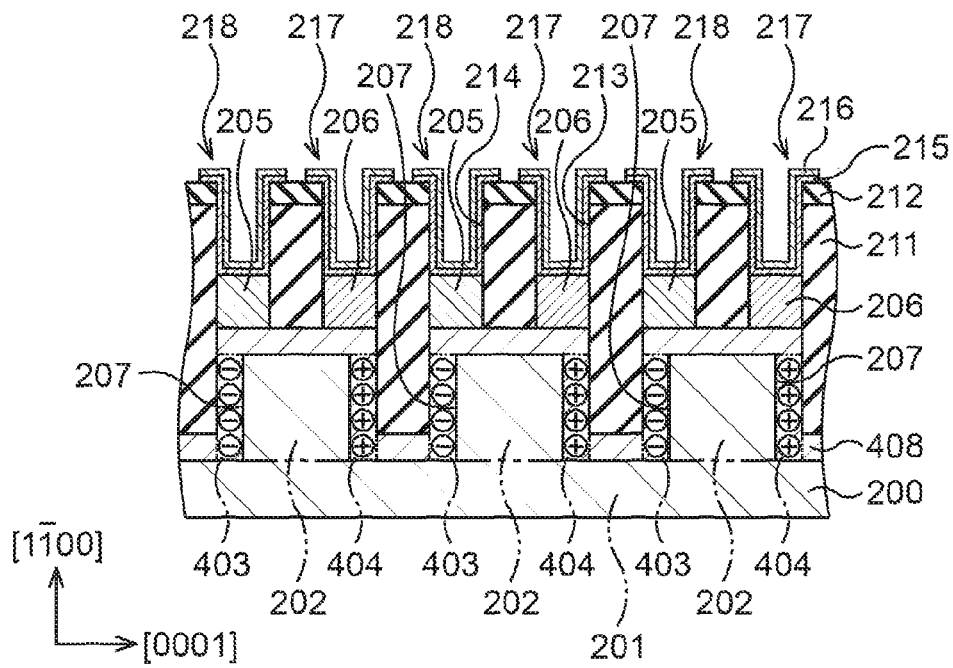
FIG. 10 is a sectional view illustrating a structure of a compound semiconductor device according to a fourth embodiment.

Next, a fourth embodiment will be described. FIG. 10 is a sectional view illustrating a structure of a compound semiconductor device (piezoelectric element) according to the fourth embodiment.

As illustrated in FIG. 10, in the fourth embodiment, an InGaN layer 408 is provided instead of the AlGaN layer 208 in the second embodiment. The InGaN layer 408 is in contact with the Ga polar plane and the N polar plane of each of the convex portions 202. Positive electric charges exist, on the Ga polar plane side of the convex portion 202, on the InGaN layer 408 side of the interface between the convex portion 202 and the InGaN layer 408, and negative electric charges exist, on the N polar plane side of the convex portion 202, on the InGaN layer 408 side of the interface between the convex portion 202 and the InGaN layer 408. For example, the negative electric charge is 2DEG, and the positive electric charge is 2DHG. In the fourth embodiment, the convex portion 202 is an example of the first nitride semiconductor layer, a portion 403 in the InGaN layer 408, the portion 403 being in contact with the N polar plane of the convex portion 202, is an example of the second nitride semiconductor layer, and a portion 404 in the InGaN layer 408, the portion 404 being in contact with the Ga polar plane of the convex portion 202, is an example of the third nitride semiconductor layer. The crystal orientations in FIG. 10 indicate crystal orientations of the GaN substrate 200 including the convex portions 202.

The ohmic electrode 205 is formed above the interface between the convex portion 202 and the portion 403, and the ohmic electrode 206 is formed above the interface between the convex portion 202 and the portion 404. The wiring 218 commonly connects the ohmic electrodes 205, and the wiring 217 commonly connects the ohmic electrodes 206. The other structure is similar to that of the second embodiment.

The effect similar to that of the second embodiment can be achieved also by the fourth embodiment.

(Fifth Embodiment)

Figure 11:
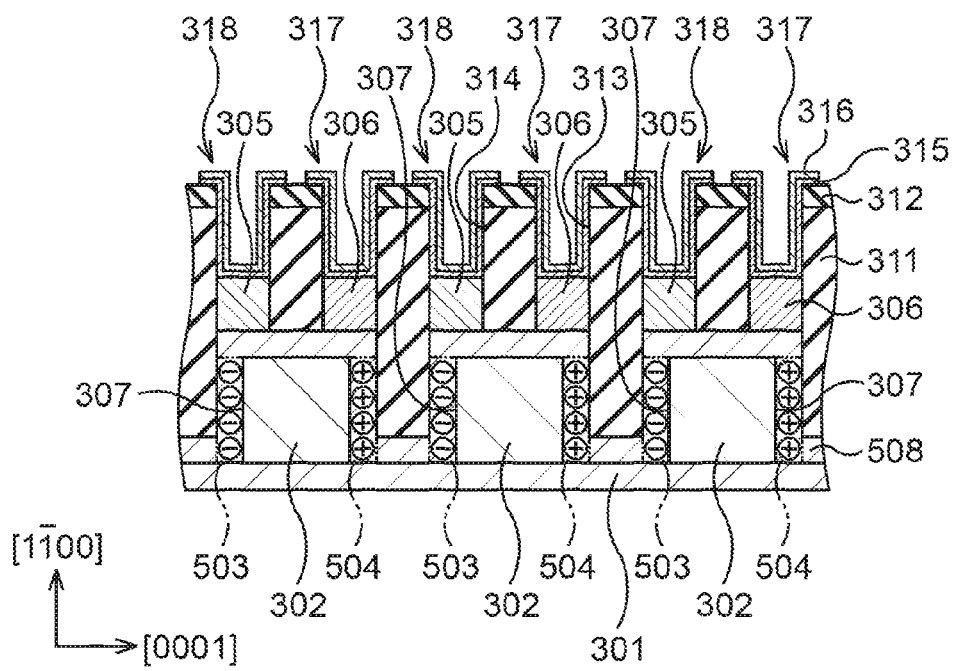
FIG. 11 is a sectional view illustrating a structure of a compound semiconductor device according to a fifth embodiment.

Next, a fifth embodiment will be described. FIG. 11 is a sectional view illustrating a structure of a compound semiconductor device (piezoelectric element) according to the fifth embodiment.

As illustrated in FIG. 11, in the fifth embodiment, an InGaN layer 508 is provided instead of the AlGaN layer 308 in the third embodiment. The InGaN layer 508 is in contact with the Ga polar plane and the N polar plane of each of the convex portions 302. Positive electric charges exist, on the Ga polar plane side of the convex portion 302, on the InGaN layer 508 side of the interface between the convex portion 302 and the InGaN layer 508, and negative electric charges exist, on the N polar plane side of the convex portion 302, on the InGaN layer 508 side of the interface between the convex portion 302 and the InGaN layer 508. For example, the negative electric charge is 2DEG, and the positive electric charge is 2DHG. In the fifth embodiment, the convex portion 302 is an example of the first nitride semiconductor layer, a portion 503 in the InGaN layer 508, the portion 503 being in contact with the N polar plane of the convex portion 302, is an example of the second nitride semiconductor layer, and a portion 504 in the InGaN layer 508, the portion 504 being in contact with the Ga polar plane of the convex portion 302, is an example of the third nitride semiconductor layer. The crystal orientations in FIG. 11 indicate crystal orientations of the convex portions 302.

The ohmic electrode 305 is formed above the interface between the convex portion 302 and the portion 503, and the ohmic electrode 306 is formed above the interface between the convex portion 302 and the portion 504. The wiring 318 commonly connects the ohmic electrodes 305, and the wiring 317 commonly connects the ohmic electrodes 306. The other structure is similar to that of the third embodiment.

The effect similar to that of the third embodiment can be achieved also by the fifth embodiment.

(Sixth Embodiment)

Figure 12:
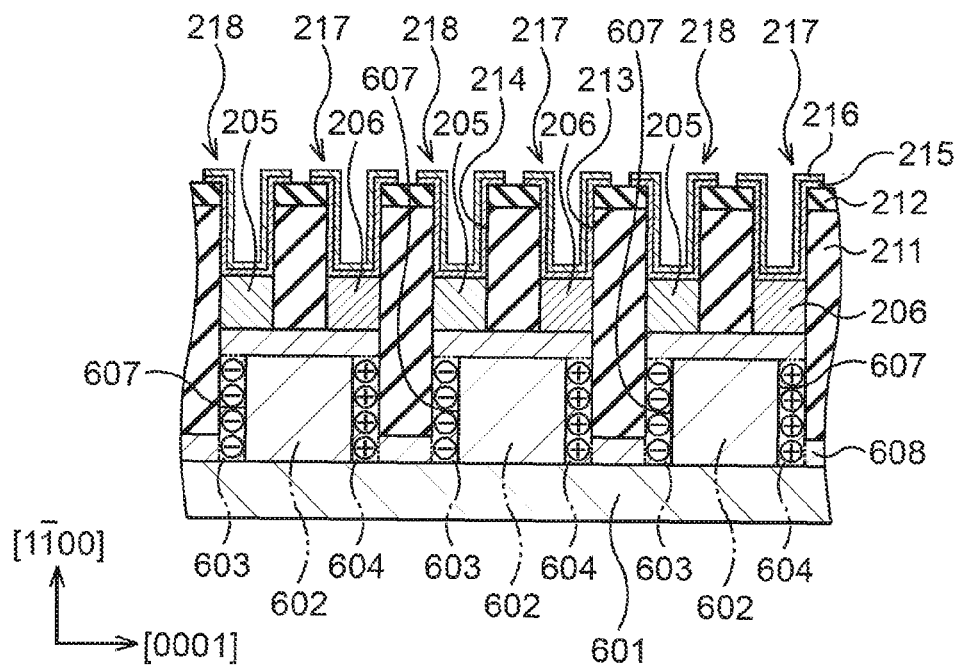
FIG. 12 is a sectional view illustrating a structure of a compound semiconductor device according to a sixth embodiment.

Next, a sixth embodiment will be described. FIG. 12 is a sectional view illustrating a structure of a compound semiconductor device (piezoelectric element) according to the sixth embodiment.

As illustrated in FIG. 12, in the sixth embodiment, a flexible part 601, convex portions 602, a GaN layer 608, and trenches 607 are provided instead of the flexible part 201, the convex portions 202, the AlGaN layer 208, and the trenches 207, respectively, in the second embodiment. The flexible part 601 is a GaN substrate whose upper surface is an m-plane, for example. The convex portion 602 is an AlGaN layer whose upper surface is an m-plane, for example. The GaN layer 608 is in contact with a Ga polar plane and an N polar plane of each of the convex portions 602. Positive electric charges exist, on the Ga polar plane side of the convex portion 602, on the GaN layer 608 side of the interface between the convex portion 602 and the GaN layer 608, and negative electric charges exist, on the N polar plane side of the convex portion 602, on the GaN layer 608 side of the interface between the convex portion 602 and the GaN layer 608. For example, the negative electric charge is 2DEG, and the positive electric charge is 2DHG. In the sixth embodiment, the convex portion 602 is an example of the first nitride semiconductor layer, a portion 603 in the GaN layer 608, the portion 603 being in contact with the N polar plane of the convex portion 602, is an example of the second nitride semiconductor layer, and a portion 604 in the GaN layer 608, the portion 604 being in contact with the Ga polar plane of the convex portion 602, is an example of the third nitride semiconductor layer. The crystal orientations in FIG. 12 indicate crystal orientations of the convex portions 602.

The ohmic electrode 205 is formed above the interface between the convex portion 602 and the portion 603, and the ohmic electrode 206 is formed above the interface between the convex portion 602 and the portion 604. Further, there are formed the wiring 218 which commonly connects the ohmic electrodes 205, and the wiring 217 which commonly connects the ohmic electrodes 206. The other structure is similar to that of the second embodiment.

The effect similar to that of the second embodiment can be achieved also by the sixth embodiment.

(Seventh Embodiment)

Figure 13:
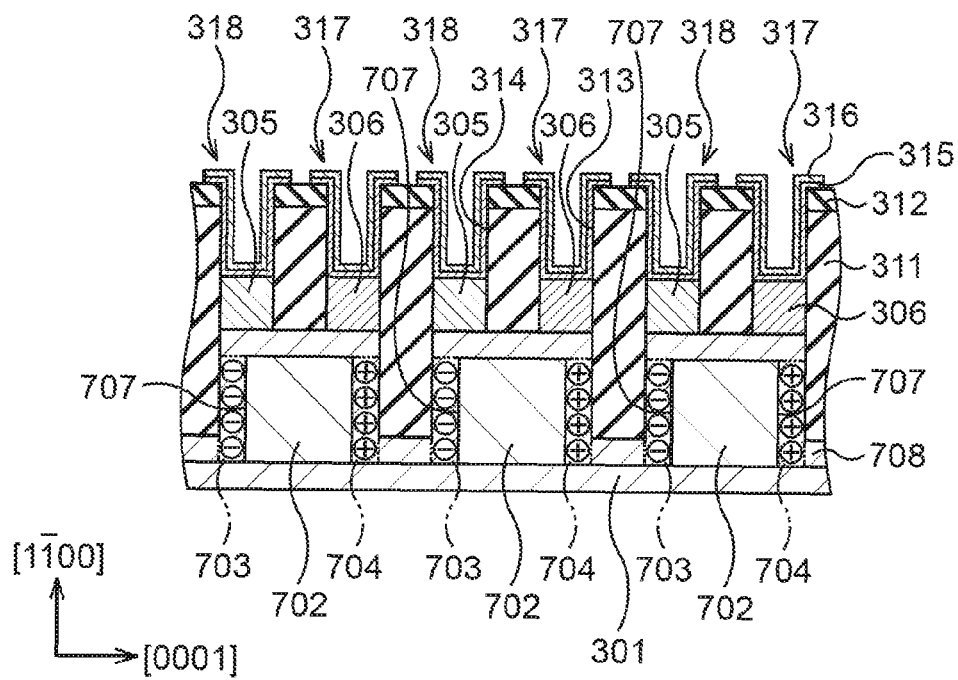
FIG. 13 is a sectional view illustrating a structure of a compound semiconductor device according to a seventh embodiment.

Next, a seventh embodiment will be described. FIG. 13 is a sectional view illustrating a structure of a compound semiconductor device (piezoelectric element) according to the seventh embodiment.

As illustrated in FIG. 13, in the seventh embodiment, convex portions 702, a GaN layer 708, and trenches 707 are provided, instead of the convex portions 302, the AlGaN layer 308, and the trenches 307, respectively, in the third embodiment. The convex portion 702 is an AlGaN layer whose upper surface is an m-plane, for example. The GaN layer 708 is in contact with a Ga polar plane and an N polar plane of each of the convex portions 702. Positive electric charges exist, on the Ga polar plane side of the convex portion 702, on the GaN layer 708 side of the interface between the convex portion 702 and the GaN layer 708, and negative electric charges exist, on the N polar plane side of the convex portion 702, on the GaN layer 708 side of the interface between the convex portion 702 and the GaN layer 708. For example, the negative electric charge is 2DEG, and the positive electric charge is 2DHG. In the seventh embodiment, the convex portion 702 is an example of the first nitride semiconductor layer, a portion 703 in the GaN layer 708, the portion 703 being in contact with the N polar plane of the convex portion 702, is an example of the second nitride semiconductor layer, and a portion 704 in the GaN layer 708, the portion 704 being in contact with the Ga polar plane of the convex portion 702, is an example of the third nitride semiconductor layer. The crystal orientations in FIG. 13 indicate crystal orientations of the convex portions 702.

The ohmic electrode 305 is formed above the interface between the convex portion 702 and the portion 703, and the ohmic electrode 306 is formed above the interface between the convex portion 702 and the portion 704. The wiring 318 commonly connects the ohmic electrodes 305, and the wiring 317 commonly connects the ohmic electrodes 306. The other structure is similar to that of the third embodiment.

The effect similar to that of the third embodiment can be achieved also by the seventh embodiment.

In the fourth to seventh embodiment, the upper surface of the convex portion 202, 302, 602, or 702 may be an a-plane, and be a non-polar plane other than the m-plane and the a-plane. The convex portion 202, 302, 602, or 702 as above may be formed with a GaN substrate whose upper surface is an a-plane, or the like, in a similar manner to the modified examples of the second or third embodiment.

The compositions of the first nitride semiconductor layer, the second nitride semiconductor layer, and the third nitride semiconductor layer are not limited in particular. For example, it is preferable that the first nitride semiconductor layer is an $In_xGa_{1-x}N$ layer ($0 \leq x \leq 1$), and each of the second and third nitride semiconductor layers is an AlGaN layer, an InAlN layer, or an InAlGaN layer. When a lattice constant of the first nitride semiconductor layer is larger than a lattice constant of each of the second and third nitride semiconductor layers as described above, the negative electrode is formed above the interface on the Ga polar plane side of the first nitride semiconductor layer, and the positive electrode is formed above the interface on the N polar plane side of the first nitride semiconductor layer. For example, it is also preferable that the first nitride semiconductor layer is an AlGaN layer, an InAlN layer, or an InAlGaN layer, and each of the second and third nitride semiconductor layers is an $In_xGa_{1-x}N$ layer ($0 \leq x \leq 1$). When the lattice constant of the first nitride semiconductor layer is smaller than the lattice constant of each of the second and third nitride semiconductor layers as described above, the positive electrode is formed above the interface on the Ga polar plane side of the first nitride semiconductor layer, and the negative electrode is formed above the interface on the N polar plane side of the first nitride semiconductor layer. It is preferable that the composition of the second nitride semiconductor layer and the composition of the third nitride semiconductor layer are the same, since the second and third nitride semiconductor layers may be formed of one layer, but the compositions may also be different from each other.

(Eighth Embodiment)

Figure 14:
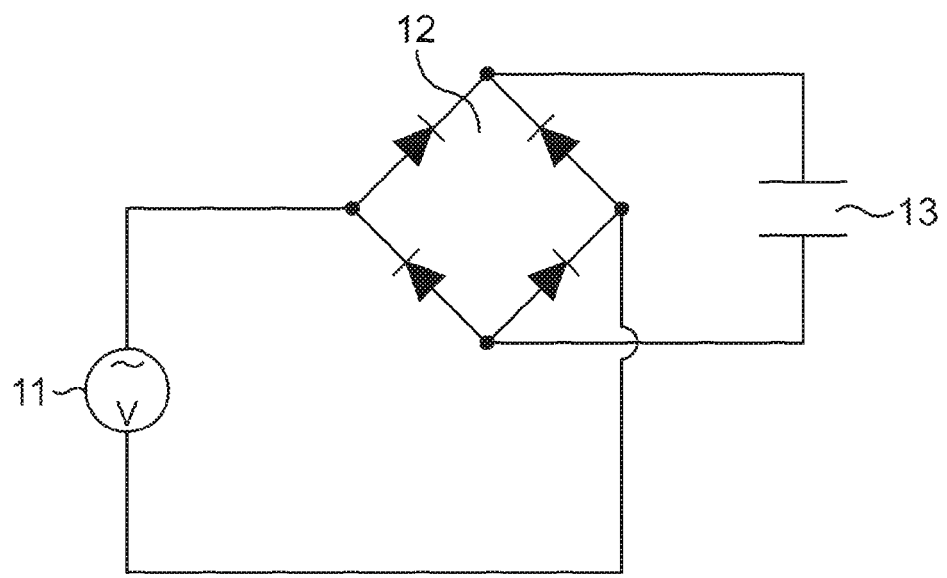
FIG. 14 is a view illustrating a configuration of a power generator according to an eighth embodiment.

Next, an eighth embodiment will be described. The eighth embodiment relates to a power generator including a piezoelectric element. FIG. 14 is a view illustrating a configuration of the power generator according to the eighth embodiment.

As illustrated in FIG. 14, in the power generator according to the eighth embodiment, a capacitor 13 is connected to a piezoelectric element 11 via a diode bridge 12. In the present embodiment, the piezoelectric element of any of the first to seventh embodiments is used for the piezoelectric element 11. In the power generator, electric charges generated in the piezoelectric element 11 are transferred to the capacitor 13 via the diode bridge 12 to be stored in the capacitor 13.

(Ninth Embodiment)

Figure 15:
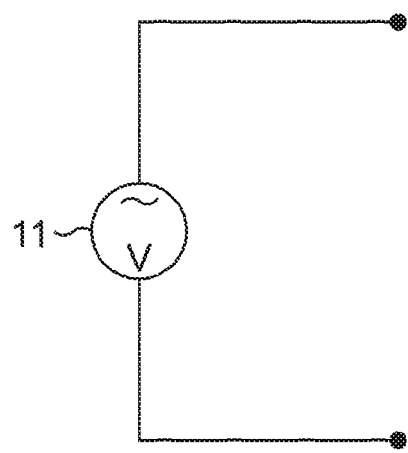
FIG. 15 is a view illustrating a configuration of a vibration sensor according to a ninth embodiment.
Figure 16:
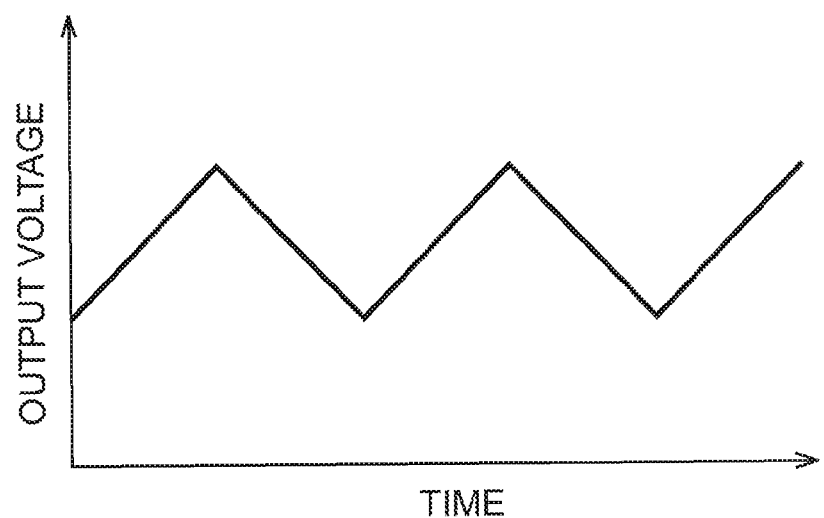
FIG. 16 is a view illustrating a change in a voltage output from the vibration sensor.
Figure 17:
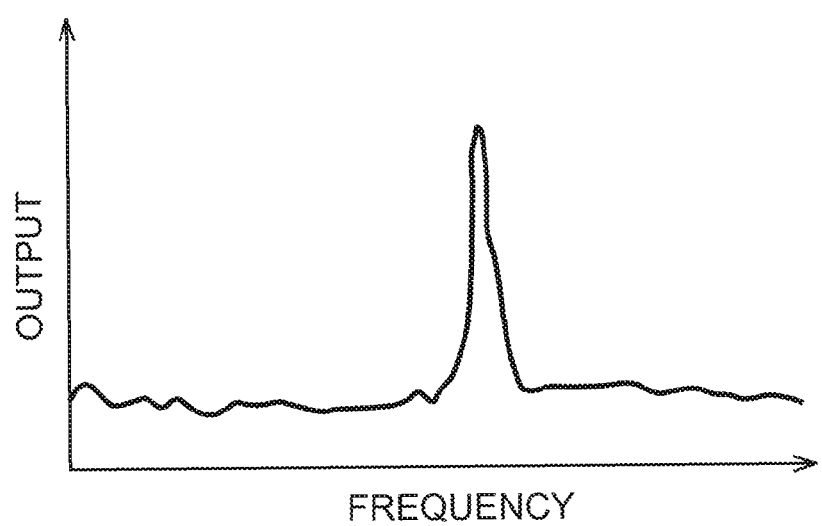
FIG. 17 is a view illustrating an analysis result of the output voltage.

Next, a ninth embodiment will be described. The ninth embodiment relates to a vibration sensor including a piezoelectric element. FIG. 15 is a view illustrating a configuration of the vibration sensor according to the ninth embodiment, FIG. 16 is a view illustrating a change in a voltage output from the vibration sensor, and FIG. 17 is a view illustrating an analysis result of the output voltage.

As illustrated in FIG. 15, the vibration sensor according to the ninth embodiment includes the piezoelectric element 11. The piezoelectric element according to any of the first to seventh embodiments is used for the piezoelectric element 11. Electric charges are discharged in accordance with vibration, which generates a voltage. For example, a voltage which fluctuates in a manner as illustrated in FIG. 16 is generated. A frequency of the vibration as illustrated in FIG. 17 may be obtained By analyzing the fluctuation of the voltage.

Note that the above-described embodiments merely illustrate concrete examples of implementing the present embodiments, and the technical scope of the present embodiments is not to be construed in a restrictive manner by these embodiments. That is, the present embodiments may be implemented in various forms without departing from the technical spirit or main features thereof.

According to each of the above-described compound semiconductor devices and the like, it is possible to achieve the high power generation efficiency with respect to the applied voltage, realized by the interaction among the first nitride semiconductor layer, the second nitride semiconductor layer, and the third nitride semiconductor layer above the flexible part.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device, comprising:
   a flexible part;
   a first nitride semiconductor layer above a surface of the flexible part, the first nitride semiconductor layer comprising a first polar plane and a second polar plane intersecting the surface;
   a second nitride semiconductor layer in contact with the first nitride semiconductor layer on the first polar plane, a lattice constant of the second nitride semiconductor layer being different from that of the first nitride semiconductor layer;
   a third nitride semiconductor layer in contact with the first nitride semiconductor layer on the second polar plane, a lattice constant of the third nitride semiconductor layer being different from that of the first nitride semiconductor layer;

a first ohmic electrode above an interface between the first nitride semiconductor layer and the second nitride semiconductor layer; and a second ohmic electrode above an interface between the first nitride semiconductor layer and the third nitride semiconductor layer, the first ohmic electrode and the second ohmic electrode being separated by a gap above the first nitride semiconductor layer.

2. The compound semiconductor device according to claim 1, wherein:
the first nitride semiconductor layer is an $In_xGa_{1-x}N$ layer ($0 \le x \le 1$); and
each of the second nitride semiconductor layer and the third nitride semiconductor layer is an AlGaN layer, an InAlN layer, or an InAlGaN layer.

3. The compound semiconductor device according to claim 1, wherein:
the first nitride semiconductor layer is an AlGaN layer, an InAlN layer, or an InAlGaN layer; and
each of the second nitride semiconductor layer and the third nitride semiconductor layer is an $In_xGa_{1-x}N$ layer ($0 \le x \le 1$).

4. The compound semiconductor device according to claim 1, wherein an upper surface of the first nitride semiconductor layer is a non-polar plane.

5. The compound semiconductor device according to claim 1, wherein a plurality of combinations each of the first nitride semiconductor layer, the second nitride semiconductor layer, the third nitride semiconductor layer, the first ohmic electrode, and the second ohmic electrode, are provided above the surface of the flexible part.

6. The compound semiconductor device according to claim 5, wherein the first ohmic electrodes are commonly connected, and the second ohmic electrodes are commonly connected.

7. A power generator, comprising
a compound semiconductor device, wherein the compound semiconductor device comprises:
a flexible part;
a first nitride semiconductor layer above a surface of the flexible part, the first nitride semiconductor layer comprising a first polar plane and a second polar plane intersecting the surface;
a second nitride semiconductor layer in contact with the first nitride semiconductor layer on the first polar plane, a lattice constant of the second nitride semiconductor layer being different from that of the first nitride semiconductor layer;
a third nitride semiconductor layer in contact with the first nitride semiconductor layer on the second polar plane, a lattice constant of the third nitride semiconductor layer being different from that of the first nitride semiconductor layer;
a first ohmic electrode above an interface between the first nitride semiconductor layer and the second nitride semiconductor layer; and
a second ohmic electrode above an interface between the first nitride semiconductor layer and the third nitride semiconductor layer, the first ohmic electrode and the second ohmic electrode being separated by a gap above the first nitride semiconductor layer.

8. A piezoelectric sensor, comprising
a compound semiconductor device, wherein the compound semiconductor device comprises:

a flexible part;
a first nitride semiconductor layer above a surface of the flexible part, the first nitride semiconductor layer comprising a first polar plane and a second polar plane intersecting the surface;
a second nitride semiconductor layer in contact with the first nitride semiconductor layer on the first polar plane, a lattice constant of the second nitride semiconductor layer being different from that of the first nitride semiconductor layer;
a third nitride semiconductor layer in contact with the first nitride semiconductor layer on the second polar plane, a lattice constant of the third nitride semiconductor layer being different from that of the first nitride semiconductor layer;
a first ohmic electrode above an interface between the first nitride semiconductor layer and the second nitride semiconductor layer; and
a second ohmic electrode above an interface between the first nitride semiconductor layer and the third nitride semiconductor layer.

9. A method of manufacturing a compound semiconductor device, comprising:
forming a first nitride semiconductor layer above a surface of a flexible part, the first nitride semiconductor layer comprising a first polar plane and a second polar plane intersecting the surface;
forming a second nitride semiconductor layer in contact with the first nitride semiconductor layer on the first polar plane and a third nitride semiconductor layer in contact with the first nitride semiconductor layer on the second polar plane, a lattice constant of the second nitride semiconductor layer being different from that of the first nitride semiconductor layer and a lattice constant of the third nitride semiconductor layer being different from that of the first nitride semiconductor layer;
forming a first ohmic electrode above an interface between the first nitride semiconductor layer and the second nitride semiconductor layer; and
forming a second ohmic electrode above an interface between the first nitride semiconductor layer and the third nitride semiconductor layer, the first ohmic electrode and the second ohmic electrode being separated by a gap above the first nitride semiconductor layer.

10. The method according to claim 9, wherein:
the first nitride semiconductor layer is an $In_xGa_{1-x}N$ layer ($0 \le x \le 1$); and
each of the second nitride semiconductor layer and the third nitride semiconductor layer is an AlGaN layer, an InAlN layer, or an InAlGaN layer.

11. The method according to claim 9, wherein:
the first nitride semiconductor layer is an AlGaN layer, an InAlN layer, or an InAlGaN layer; and
each of the second nitride semiconductor layer and the third nitride semiconductor layer is an $In_xGa_{1-x}N$ layer ($0 \le x \le 1$).

12. The method according to claim 9, wherein the forming the first nitride semiconductor layer comprises forming a trench in a compound semiconductor substrate, the upper surface of the compound semiconductor substrate being a non-polar plane, and the first polar plane and the second polar plane being exposed from the trench.

13. The method according to claim 12, wherein the compound semiconductor substrate is a GaN substrate.

14. The method according to claim 9, wherein the forming the first nitride semiconductor layer, comprises:

forming the first nitride semiconductor layer above a substrate, an upper surface of the first nitride semiconductor layer being a non-polar plane; and forming a trench in the first nitride semiconductor layer, the first polar plane and the second polar plane being exposed from the trench.

15. The method according to claim 14, wherein the substrate is one selected from the group consisting of a sapphire substrate, a SiC substrate, an AlN substrate, a $LiAlO_2$ substrate, a $LiGaO_2$ substrate, a ZnO substrate, a patterned Si substrate, and a patterned sapphire substrate.

16. The method according to claim 9, wherein a plurality of combinations each of the first nitride semiconductor layer, the second nitride semiconductor layer, the third nitride semiconductor layer, the first ohmic electrode, and the second ohmic electrode, are provided above the surface of the flexible part.

17. The method according to claim 16, wherein the first ohmic electrodes are commonly connected, and the second ohmic electrodes are commonly connected.

* * * * *